(12) United States Patent
Kim et al.

(10) Patent No.: US 9,929,172 B2
(45) Date of Patent: Mar. 27, 2018

(54) METHOD OF VERIFYING LAYOUT OF VERTICAL MEMORY DEVICE

(71) Applicants: Ki-Won Kim, Seongnam-si (KR); Sung-Hoon Kim, Seongnam-si (KR); Jae-Ick Son, Hwaseong-si (KR)

(72) Inventors: Ki-Won Kim, Seongnam-si (KR); Sung-Hoon Kim, Seongnam-si (KR); Jae-Ick Son, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 36 days.

(21) Appl. No.: 15/253,320

(22) Filed: Aug. 31, 2016

(65) Prior Publication Data
US 2017/0243882 A1      Aug. 24, 2017

(30) Foreign Application Priority Data
Feb. 22, 2016      (KR) .................. 10-2016-0020706

(51) Int. Cl.
| | | |
|---|---|---|
| H01L 27/115 | (2017.01) | |
| H01L 27/11582 | (2017.01) | |
| G11C 16/04 | (2006.01) | |
| G11C 16/06 | (2006.01) | |
| H01L 27/02 | (2006.01) | |
| H01L 27/11565 | (2017.01) | |
| H01L 27/1157 | (2017.01) | |

(52) U.S. Cl.
CPC .... *H01L 27/11582* (2013.01); *G11C 16/0466* (2013.01); *G11C 16/06* (2013.01); *H01L 27/0207* (2013.01); *H01L 27/1157* (2013.01); *H01L 27/11565* (2013.01)

(58) Field of Classification Search
CPC ........... H01L 27/0207; H01L 27/11556; H01L 27/11582
See application file for complete search history.

(56) References Cited

U.S. PATENT DOCUMENTS

| | | | | |
|---|---|---|---|---|
| 5,828,615 A | * | 10/1998 | Mukunoki | ............. G11C 5/147 365/145 |
| 9,048,224 B2 | | 6/2015 | Iguchi et al. | |
| 9,099,349 B2 | | 8/2015 | Kofuji et al. | |
| 9,177,613 B2 | | 11/2015 | Lee et al. | |
| 2014/0054676 A1 | | 2/2014 | Nam et al. | |
| 2015/0145021 A1 | | 5/2015 | Jang et al. | |
| 2015/0179661 A1 | * | 6/2015 | Huo | ...................... H01L 21/764 257/57 |

* cited by examiner

*Primary Examiner* — Michael Carter
(74) *Attorney, Agent, or Firm* — Volentine & Whitt, PLLC

(57) ABSTRACT

A method of verifying a layout of a vertical memory device includes classifying a plurality of channel holes included in the layout of the vertical memory device into a plurality of types based on at least one of a distance between each channel hole and an isolation region adjacent thereto, shapes of the plurality of channel holes in the layout, and coordinates of the plurality of channel holes in the layout. Types of channel holes connected to each of a plurality of bit lines included in the layout are identified, and a determination is made whether loads of the plurality of bit lines are equalized, based on the identified types of the channel holes for each bit line.

20 Claims, 20 Drawing Sheets

FIG. 11

TABLE 1

|     | SSL1  | SSL2  |
| --- | ----- | ----- |
| BL1 | Inner | Outer |
| BL2 | Outer | Inner |
| BL3 | Outer | Inner |
| BL4 | Inner | Outer |

FIG. 14

|  | SSL1 | SSL2 |
|---|---|---|
| BL1 | Winner | Winner |
| BL2 | Souter | Souter |
| BL3 | Wouter | Wouter |
| BL4 | Sinner | Sinner |

TABLE 2

METHOD OF VERIFYING LAYOUT OF VERTICAL MEMORY DEVICE

CROSS-REFERENCE TO RELATED APPLICATION

This application claims the benefit of Korean Patent Application No. 10-2016-0020706, filed on Feb. 22, 2016, in the Korean Intellectual Property Office, the disclosure of which is incorporated herein in its entirety by reference.

BACKGROUND

The disclosure relates to a memory device, and more particularly, to a method of verifying a layout of a vertical memory device.

Memory devices are used to store data and are classified as volatile memory devices or nonvolatile memory devices. Flash memory devices, which are an example of nonvolatile memory devices, may be used in mobile phones, digital cameras, personal digital assistants (PDAs), portable computers, desktop computers, and other devices. Recently, vertical memory devices have been developed to increase the storage capacity and achieve miniaturization of nonvolatile memory devices. Vertical memory devices include a plurality of memory cells or a plurality of memory cell arrays vertically stacked on a substrate. In vertical memory devices in which channel holes having a multi-hole structure are formed, the characteristics of memory cells formed in the channel holes may vary according to a distance between each channel hole and an isolation region adjacent thereto.

SUMMARY

According to an aspect of the disclosure, there is provided a method of verifying a layout of a vertical memory device includes classifying a plurality of channel holes included in the layout of the vertical memory device into a plurality of types based on at least one of a distance between each channel hole and an isolation region adjacent thereto, shapes of the plurality of channel holes in the layout, and coordinates of the plurality of channel holes in the layout. Types of channel holes connected to each of a plurality of bit lines included in the layout are identified, and a determination is made whether loads of the plurality of bit lines are equalized, based on the identified types of the channel holes for each bit line.

According to another aspect of the disclosure, there is provided a method of verifying a layout of a vertical memory device. The method includes measuring sizes of conductive lines connecting a plurality of channel holes to each of a plurality of bit lines in the layout of the vertical memory device, and verifying whether loads of the plurality of bit lines are equalized, based on the measured sizes for each bit line.

According to another aspect of the disclosure, there is provided a method of manufacturing a vertical memory device. The method includes determining, for each of a plurality of bit lines, a load presented by channel holes and conductive traces connecting the channel holes to the bit line, based upon a layout of the vertical memory device. A determination is made whether the load presented to each of the bit lines is equalized with the load presented to every other of the bit lines. Upon determining that the loads of the bit lines are equalized, an etching mask is manufactured for the vertical memory device based upon the layout. The vertical memory device is manufactured by etching a multi-layered device to which the etching mask has been applied. The load presented to each of the bit lines, within the manufactured vertical memory device, is equalized with the load presented to every other of the bit lines, within the manufactured vertical memory device.

BRIEF DESCRIPTION OF THE DRAWINGS

Embodiments of the disclosure will be more clearly understood from the following detailed description taken in conjunction with the accompanying drawings in which:

FIG. 11 is a table illustrating a result of classifying channel holes in the layout of FIG. 9;

FIG. 14 is a table illustrating a result of classifying channel holes in the layout of FIG. 13;

DETAILED DESCRIPTION OF THE EMBODIMENTS

Figure 1:
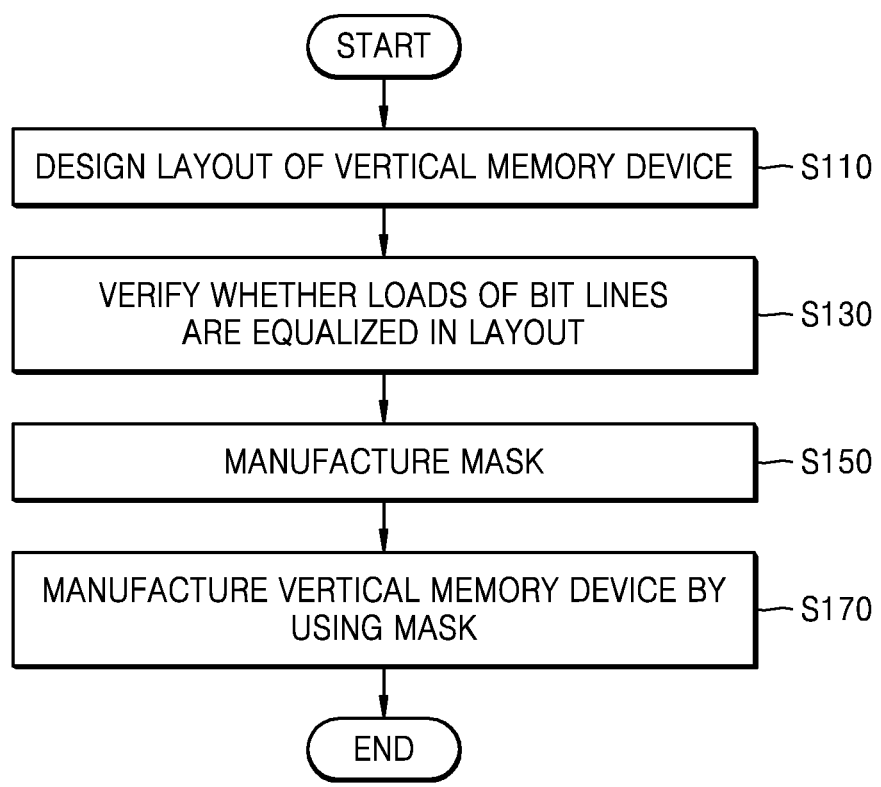
FIG. 1 is a flowchart illustrating a method of manufacturing a vertical memory device according to an embodiment.

FIG. 1 is a flowchart illustrating a method of manufacturing a vertical memory device according to an embodiment.

Referring to FIG. 1, in operation S110, a layout of a vertical memory device is designed. The vertical memory device refers to a memory device that includes a memory cell array formed of a plurality of memory cells vertically stacked on a substrate. The memory cell array will be described with reference to FIG. 2. The layout may be a physical structure that allows designed circuits for the vertical memory device to be transferred on a wafer and may include a plurality of patterns. The patterns may correspond to circuits directly associated with operations of the vertical memory device, interconnections, etc.

In operation S130, whether loads of bit lines in the layout are equalized is verified by using, for example, a verification tool. The verification tool may receive layout data and verify whether the loads of the bit lines are equalized, based on the received layout data. For example, the verification tool may be software that includes a plurality of instructions executable on a processor and may be stored in a non-transitory computer-readable storage medium.

In an embodiment, whether the loads of the bit lines are equalized may be verified by checking whether types of a plurality of channel holes connected to each bit line are regularly distributed. In the vertical memory device, characteristics of memory cells formed in channel holes may vary according to a distance between each channel hole and an isolation region (e.g., a word line cut region) adjacent thereto. Accordingly, load mismatch among bit lines may cause a decrease in an operating speed and performance of the vertical memory device.

According to an embodiment, whether the loads of the bit lines in the layout are equalized may be verified. If a verification result indicates that the loads of the bit lines are equalized, the vertical memory device may be formed based on the verified layout. Otherwise, loads of the bit lines may be equalized by changing a route between a bit line and a channel hole.

In operation S150, a mask is manufactured. An optical proximity correction (OPC) operation or a post-simulation operation may be performed between operation S130 and operation S150. The OPC operation may be an operation of changing patterns in the layout to correct an error due to an optical proximity effect (OPE). The mask may be manufactured by performing an exposure process on a substrate for the mask by using a pattern of the layout or a corrected pattern thereof. After the exposure process, the mask may be manufactured by further performing a series of processes such as a development process, an etching process, a cleaning process, and a bake process.

In operation S170, the vertical memory device is formed by performing various semiconductor processes on a semiconductor substrate (e.g., a wafer) by using the mask. For example, the mask may be used when performing a patterning process by using a lithography process. A target pattern may be formed on the semiconductor substrate or a material layer by the patterning process.

The semiconductor processes may include a deposition process, an etching process, an ion process, a cleaning process, etc. The deposition process may include various processes for forming a material layer, such as a chemical vapor deposition (CVD) process, a sputtering process, and a spin coating process. The ion process may include an ion implantation process, a diffusion process, an annealing process, etc. Furthermore, the semiconductor processes may include a packing process in which a semiconductor device is mounted on a printed circuit board (PCB) and is mold with a molding member and a test process in which the semiconductor device or the package is tested.

Figure 2:
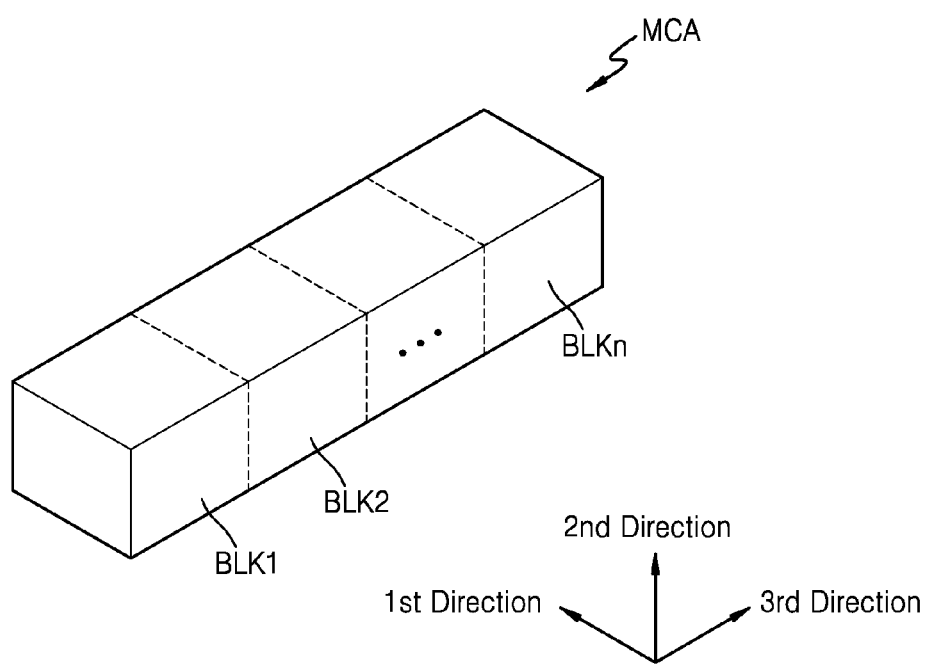
FIG. 2 is a drawing illustrating a memory cell array according to an embodiment.

FIG. 2 is a drawing illustrating a memory cell array MCA according to an embodiment.

Referring to FIG. 2, the memory cell array MCA may include a plurality of memory blocks BLK1 to BLKn, each of which has a three-dimensional (3D) structure (or a vertical structure). For this reason, the memory cell array MCA may be referred to as a "3D memory cell array." For example, the vertical memory device of FIG. 1 may include the memory cell array MCA.

In an embodiment, the 3D memory cell array is monolithically formed in one or more physical levels of arrays of memory cells having an active area above a silicon substrate and circuitry associated with the operation of the memory cells. The associated circuitry may be above or within the silicon substrate. The term "monolithic" means that layers of each level of the 3D memory cell array are directly deposited on layers of each underlying level of the 3D memory cell array.

In an embodiment, the 3D memory cell array includes NAND strings that are vertically oriented such that at least one memory cell is located over another memory cell. The at least one memory cell may include a charge trap layer. The following patent documents, which are hereby incorporated by reference, describe suitable configurations for 3D memory arrays, in which the 3D memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
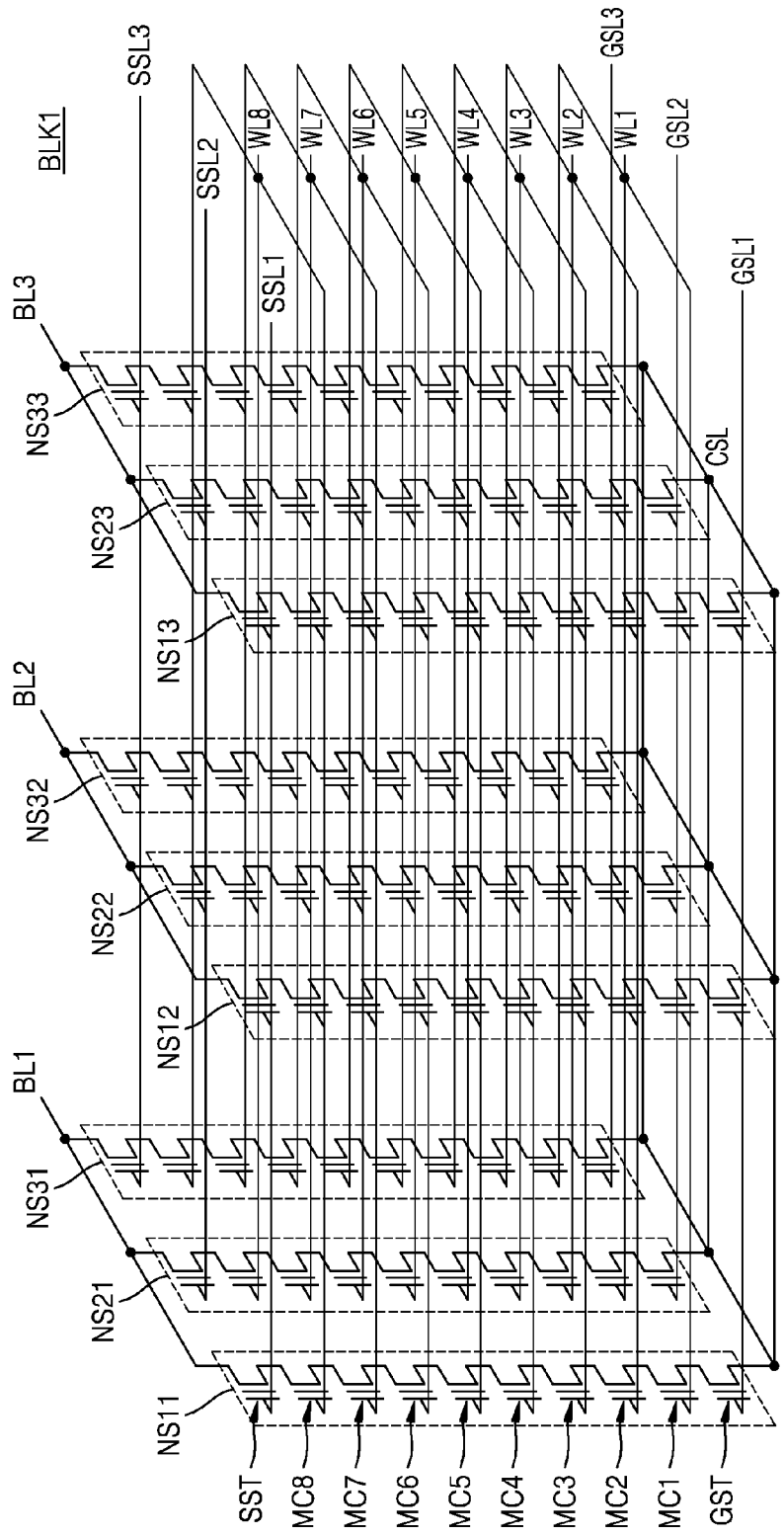
FIG. 3 is a circuit diagram schematically illustrating one of memory blocks included in a memory cell array of a nonvolatile memory device of FIG. 2.

FIG. 3 is a circuit diagram illustrating an equivalent circuit of a first memory block BLK1 of memory blocks included in the memory cell array MCA of FIG. 2.

Referring to FIG. 3, the first memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. A number of the NAND strings, a number of the word lines, a number of the bit lines, a number of the ground selection lines, and a number of the string selection lines may be variously changed according to embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (e.g., NS11) may include a string selection transistor SST, a plurality of memory cells MC1 to MC8, and a ground selection transistor GST that are connected in series. Below, for descriptive convenience, the NAND string may be referred to as the "string."

Strings that are connected in common to a bit line constitute a column. For example, the strings NS11, NS21, and NS31 connected in common to the first bit line BL1 may correspond to a first column, the strings NS12, NS22, and NS32 connected in common to the second bit line BL2 may correspond to a second column, and the strings NS13, NS23, and NS33 connected in common to the third bit line BL3 may correspond to a third column.

Strings that are connected in common to a string selection line constitute a row. For example, the strings NS11, NS12, and NS13 connected in common to the first string selection line SSL1 may correspond to a first row, the strings NS21, NS22, and NS23 connected in common to the second string selection line SSL2 may correspond to a second row, and the strings NS31, NS32, and NS33 connected in common to the third string selection line SSL3 may correspond to a third row.

In each string, the string selection transistor SST is connected to one of the string selection lines SSL1, SSL2, and SSL3. In each string, the plurality of memory cells MC1 to MC8 are connected to the word lines WL1 to WL8, respectively. In each string, the ground selection transistor GST is connected to one of the ground selection lines GSL1, GSL2, and GSL3. In each string, the string selection transistor SST is connected to one of the bit lines BL1, BL2, and BL3 and the ground selection transistor GST is connected to the common source line CSL.

In an embodiment, word lines (e.g., WL1) of the same height are connected in common to each other, the string selection lines SSL1 to SSL3 are separated from each other, and the ground selection lines GSL1 to GSL3 are separated from each other. For example, the first word line WL1 and the first string selection line SSL1 are selected to program memory cells that are connected to the first word line WL1 and belong to the strings NS11, NS12, and NS13. However, embodiments are not limited thereto. In some embodiments, the ground selection lines GSL1 to GSL3 may be connected in common to each other.

In the embodiment illustrated in FIG. 3, each string includes one string selection transistor. However, embodiments are not limited thereto. For example, each string may include an upper string selection transistor and a lower string selection transistor that are connected in series. In this case, in each string, the upper string selection transistor may be connected to a bit line, and the lower string selection transistor may be connected between the upper string selection transistor and the memory cell MC8.

Figure 4:
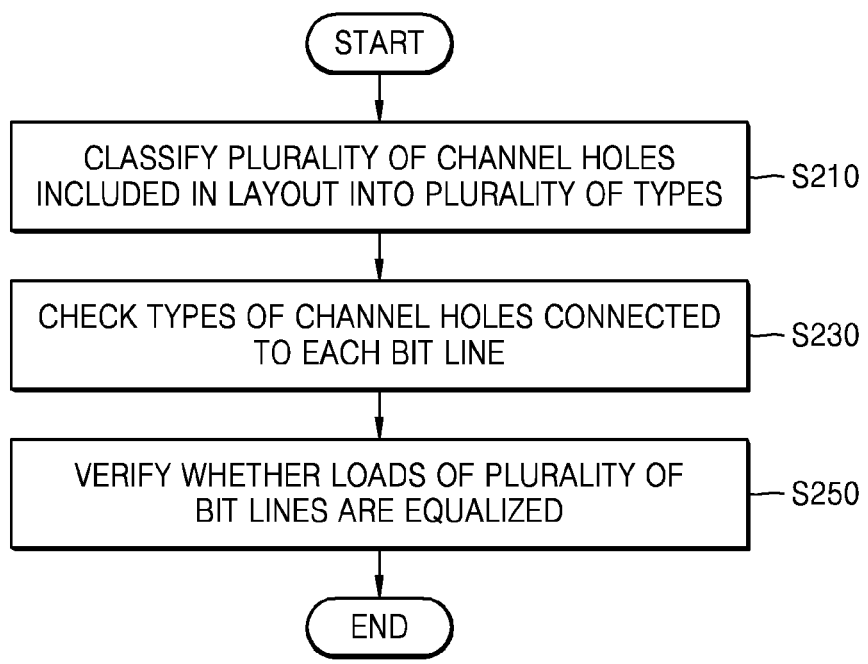
FIG. 4 is a flowchart illustrating a method of verifying a layout of a vertical memory device, according to an embodiment.

FIG. 4 is a flowchart illustrating a method of verifying a layout of a vertical memory device, according to an embodiment.

Referring to FIG. 4, the layout verifying method according to an embodiment may correspond to one embodiment of operation S130 of FIG. 1. Accordingly, a description given with reference to FIGS. 1 to 3 may be applied to the embodiment of FIG. 4, and a duplicated description thereof is thus omitted.

In operation S210, a plurality of channel holes in the layout of the vertical memory device are classified into a plurality of types. A number of types may be variously changed according to embodiments. Furthermore, a criterion (hereinafter referred to as a "classification criterion") for classifying the plurality of channel holes into the plurality of types may be variously changed according to embodiments. In particular, in an embodiment, a distance between each channel hole and an isolation region adjacent thereto may be used as the classification criterion. In an embodiment, shapes of the plurality of channel holes in the layout may be used as the classification criterion. In an embodiment, coordinates of the plurality of channel holes in the layout may be used as the classification criterion. Furthermore, in an embodiment, a classification table may be created according to the classification result. In an embodiment, a corrected layout may be created by expressing the plurality of channels of the layout differently for respective types on the basis of the classification result.

Characteristics of the plurality of channel holes may be different from each other in a process of manufacturing the vertical memory device, and the plurality of channel holes may be classified into the plurality of types based on the characteristics of the plurality of channel holes. For example, in the cases where all channel holes connected to a first bit line are of a first type and where all channel holes connected to a second bit line are of a second type, loads of the first and second bit lines may be different from each other (load mismatch). This will be described below with reference to FIGS. 5 to 7.

In operation S230, types of channel holes connected to each bit line are checked. For example, in the case where the plurality of channel holes is classified into the first type and the second type, a first number of channel holes of the first type, from among the channel holes connected to each bit line, and a second number of channel holes of the second type, from among the channel holes connected to each bit line, may be determined. Below, the first number of channel holes and the second number of channel holes associated with each bit line may be referred to as a "check result" of each bit line.

In operation S250, whether loads of bit lines are equalized is verified. In particular, whether the loads of the bit lines are equalized is verified based on the check results of the plurality of bit lines. In an embodiment, the first number of channel holes and the second number of channel holes may be compared for each bit line. Bit lines in which the first number of channel holes and the second number of channel holes are the same may be determined as bit lines having equalized loads. In contrast, bit lines in which the first number of channel holes and the second number of channel holes are different from each other may be determined as bit lines having non-equalized loads.

The layout verifying method according to an embodiment may be implemented in the form of a program instruction(s) that is executable on various computers and may be recorded in a non-transitory computer-readable medium. The non-transitory computer-readable medium may include program instructions, data files, data structures, etc. independently or may include a combination thereof. The program instruction(s) recorded in the medium may be specially designed and configured for the embodiments or may also be known and available to those skilled in computer software. The non-transitory computer-readable medium may include hardware devices, which are specially configured to store and execute program instructions, such as magnetic media, optical recording media (e.g., CD-ROM and DVD), magneto-optical media (e.g., a floptical disk), read only memories (ROMs), random access memories (RAMs), and flash memories. Examples of computer programs include not only machine language codes created by a compiler, but also high-level language codes that are capable of being executed by a computer by using an interpreter or the like.

Figure 5:
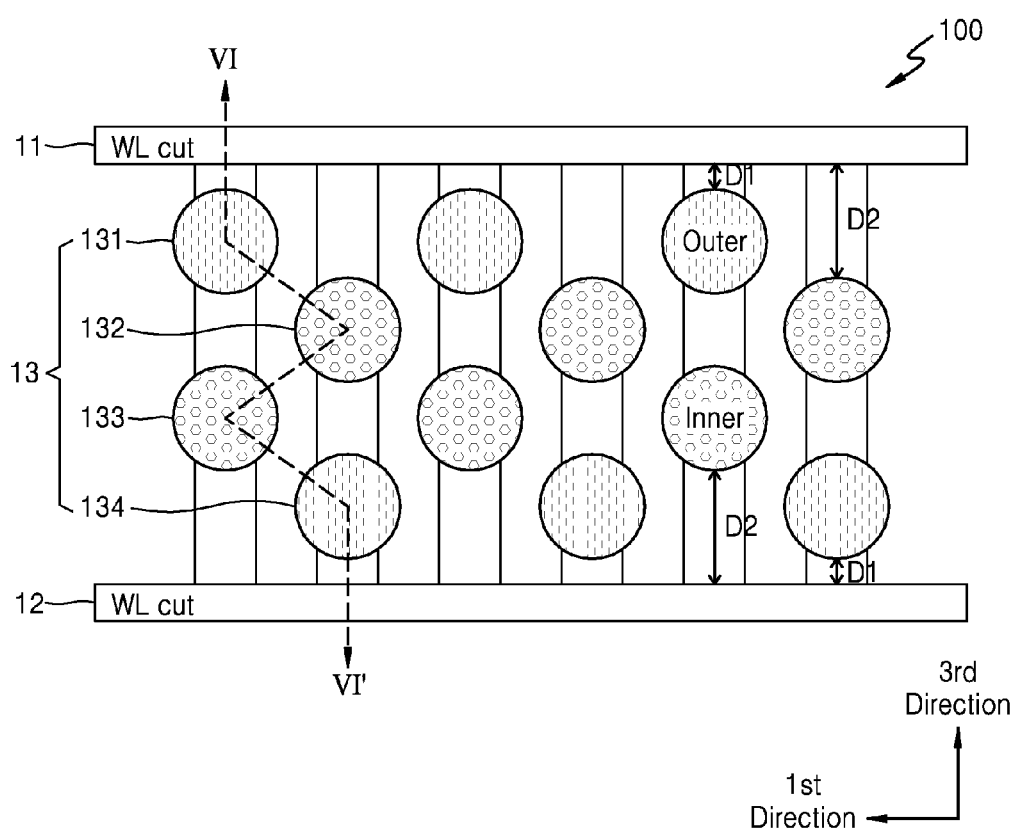
FIG. 5 is a view illustrating an example of a layout of a vertical memory device, according to an embodiment.

FIG. 5 is a view illustrating an example of a layout 100 of a vertical memory device, according to an embodiment.

Referring to FIG. 5, the layout 100 includes first and second word line cut regions 11 and 12 and a plurality of channel holes 13. The first and second word line cut regions 11 and 12 may extend in a first direction and may be disposed in parallel with each other. The plurality of channel holes 13 may be between the first and second word line cut regions 11 and 12. In this case, the plurality of channel holes 13 may be connected in common to a string selection line, and the plurality of channel holes 13 may be connected to different bit lines.

In an embodiment, the plurality of channel holes 13 may be classified into two types based on a distance between each channel hole and a word line cut region adjacent thereto. Outer holes, which are relatively close to the adjacent word line cut regions, from among the plurality of channel holes 13, may be classified as the first type, and inner holes, which are relatively distant from the adjacent word line cut regions, from among the plurality of channel holes 13, may be classified as the second type. However, embodiments are not limited thereto. For example, the plurality of channel holes 13 may be classified into two types based on shapes of the plurality of channel holes 13 in the layout or coordinates of the plurality of channel holes 13 in the layout.

In particular, a first channel hole 131 that is spaced apart from the first word line cut region 11 by a first distance D1 may be classified as the first type, and a second channel hole 132 that is spaced apart from the first word line cut region 11 by a second distance D2 may be classified as the second type. Furthermore, a third channel hole 133 that is spaced apart from the second word line cut region 12 by the second distance D2 may be classified as the second type, and a fourth channel hole 134 that is spaced apart from the second word line cut region 12 by the first distance D1 may be classified as the first type. In this case, the second distance D2 may be greater than the first distance D1.

Figure 6A:
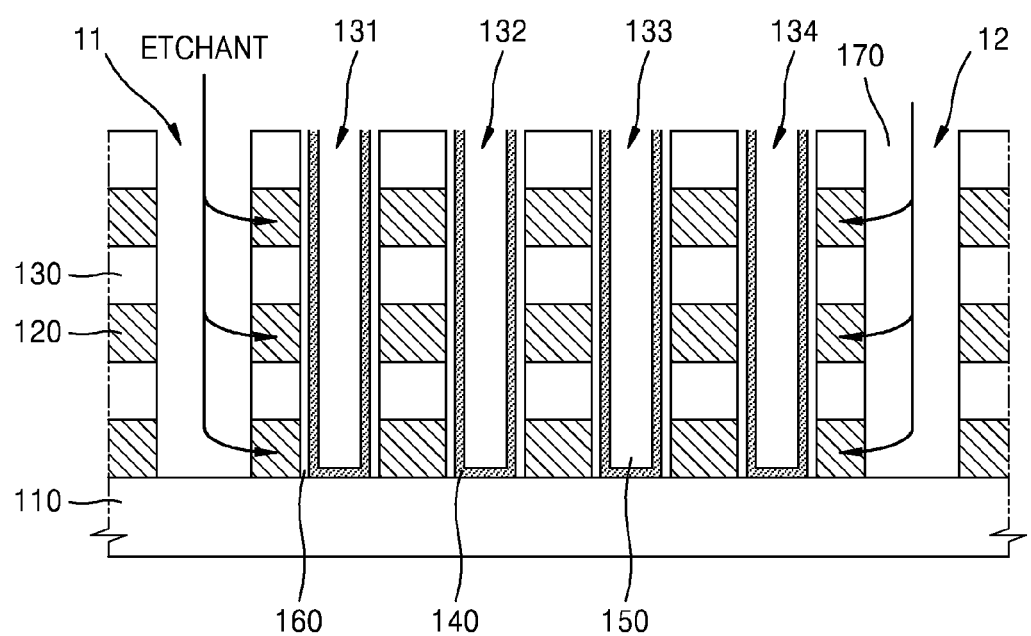
FIGS. 6A and 6B are views taken along a line VI-VI' of FIG. 5 to describe a method of manufacturing a vertical memory device, according to an embodiment.
Figure 6B:
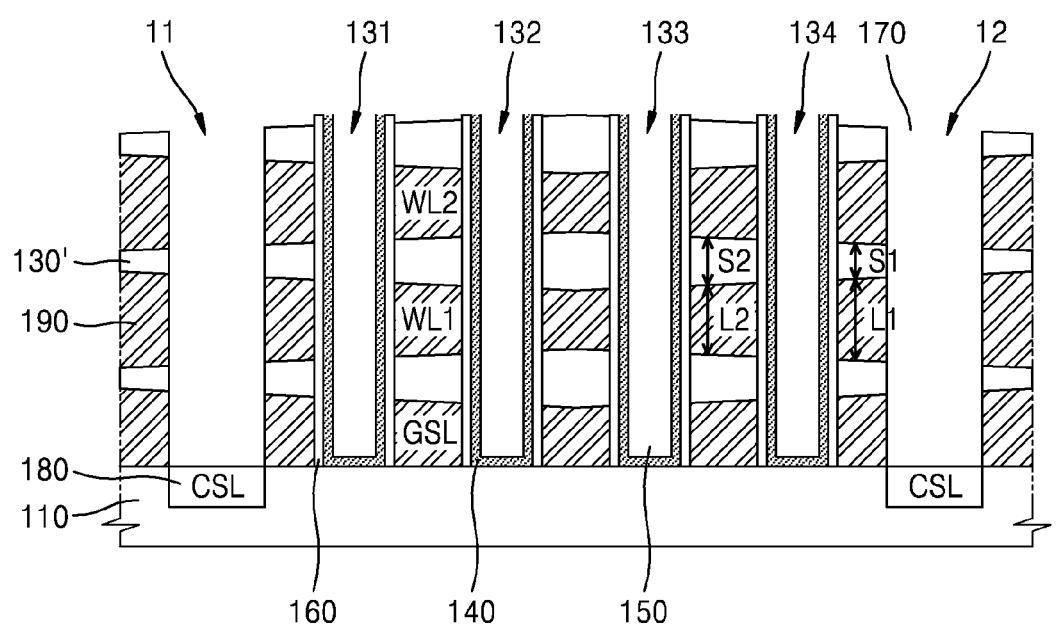

FIGS. 6A and 6B are views illustrating an example of a method of manufacturing a vertical memory device, according to an embodiment. FIGS. 6A and 6B may correspond to an example of operation S170 of FIG. 1, and FIGS. 6A and 6B may correspond to a sectional view taken along a line VI-VI' of FIG. 5.

Referring to FIG. 6A, a mold structure is formed by repeatedly, alternately stacking a sacrificial layer 120 and an interlayer insulating layer 130 on a substrate 110. The substrate 110 may be a semiconductor substrate. For example, the semiconductor substrate may include one of silicon, silicon-on-insulator, silicon-on-sapphire, germanium, silicon-germanium, and gallium-arsenic. The sacrificial layer 120 may include a material that has an etch selectivity with respect to the interlayer insulating layer 130 and is easily removed by a wet-etching process. A ratio of an etch rate of the sacrificial layer 120 to an etch rate of the interlayer insulating layer 130 may be, for example, approximately 100:1. The sacrificial layers 120 may include a nitride-based material such as silicon nitride (SiN) or silicon boron nitride (SiBN). The interlayer insulating layers 130 may include an oxide-based material such as silicon oxide, silicon carbonitride, or silicon acid fluoride. The sacrificial layers 120 and the interlayer insulating layers 130 may be formed through a chemical vapor deposition (CVD) process, a plasma enhanced CVD (PECVD) process, a spin coating process, etc.

Afterwards, the plurality of channel holes 131 to 134 are formed to penetrate the sacrificial layers 120 and the interlayer insulating layers 130, and a pillar that includes a surface layer 140 and an inner layer 150 is formed in each of the channel holes 131 to 134. In this case, the surface layer 140 may act as a channel region and may include, for example, a silicon material of a first conductivity type. The inner layer 150 may include an insulating material such as silicon oxide or an air gap.

Furthermore, charge storage layers 160 are formed on sidewalls of the channel holes 131 to 134. In this case, each of the charge storage layers 160 may include a blocking insulating layer, a charge trap layer, and a tunneling insulating layer. For example, each of the charge storage layers 160 may have an oxide-nitride-oxide (ONO) structure. However, embodiments are not limited thereto. For example, the charge storage layer 160 may be formed after the wet-etching process and before gate electrodes 190 are formed. In this case, the charge storage layer 160 may be formed along outer sidewalls of the interlayer insulating layers 130 and an exposed surface layer 140.

Furthermore, trenches 170 are formed to penetrate partial regions of the sacrificial layers 120 and the interlayer insulating layers 130. The partial regions may correspond to the word line cut regions 11 and 12. Afterwards, the sacrificial layers 120 may be selectively etched by performing the wet-etching process in which etchant having an etch selectivity with respect to silicon nitride is provided into the trenches 170. For example, $H_3PO_4$ may be used as the etchant.

Referring to FIG. 6B, a common source line (CSL) 180 is formed in the word line cut regions 11 and 12 by injecting dopants (or impurities) through the trenches 170. As the wet-etching process is performed, the sacrificial layers 120 are removed while interlayer insulating layers 130' are partially removed. Accordingly, gaps are formed between the interlayer insulating layers 130'. An outer sidewall of the charge storage layer 160 may be partially exposed through the gaps. Gate electrodes 190 are formed on the exposed outer sidewalls of the charge storage layer 160 and the interlayer insulating layers 130'. Accordingly, the sacrificial layers 120 of each layer may be replaced with the gate electrodes 190. For example, the gate electrodes 190 may include a ground selection line GSL and first and second word lines WL1 and WL2.

Since the etchant is provided through the trenches 170 corresponding to the word line cut regions 11 and 12, the etched amount of the sacrificial layers 120 and the interlayer insulating layers 130' corresponding to outer channel holes adjacent to the word line cut regions 11 and 12, that is, the first and fourth channel holes 131 an 134 may be greater than that of the sacrificial layers 120 and the interlayer insulating layers 130' corresponding to inner channel holes not adjacent to the word line cut regions 11 and 12, that is, the second and third channel holes 132 and 133.

Accordingly, in a length of the first word line WL1, a first length L1 corresponding to an outer channel hole, that is, the fourth channel hole 134, may be greater than a second length L2 corresponding to an inner channel hole, that is, the third channel hole 133. Furthermore, in a space between the first word line WL1 and the second word line WL2, a first space S1 corresponding to the outer channel hole, that is, the fourth channel hole 134, may be less than a second space S2 of the inner channel hole, that is, the third channel hole 133. Accordingly, interference between the first and second word lines WL1 and WL2 corresponding to the outer channel hole, that is, the fourth channel hole 134, increases.

As such, characteristics of word lines corresponding to a channel hole may be different from each other according to a distance between the channel hole and a word line cut region adjacent thereto. This means that characteristics of memory cells formed in the channel hole are different from each other. In particular, as a distance between a channel hole and a word line cut region adjacent thereto decreases, the interference between word lines corresponding to the channel hole may increase. For this reason, in the case where the same voltage is applied to the word lines, an operating speed of memory cells connected to the word lines may increase.

In the case where the outer channel holes, that is, the first and fourth channel holes 131 and 134, are connected to a first bit line and the inner channel holes, that is, the second and third channel holes 132 and 133, are connected to a second bit line, loads of the first and second bit lines may be different from each other (load mismatch). Meanwhile, in the case where the first and second channel holes 131 and 132 are connected to the first bit line and the third and fourth channel holes 133 and 134 are connected to the second bit line, the loads of the first and second bit lines may be equalized.

Figure 7:
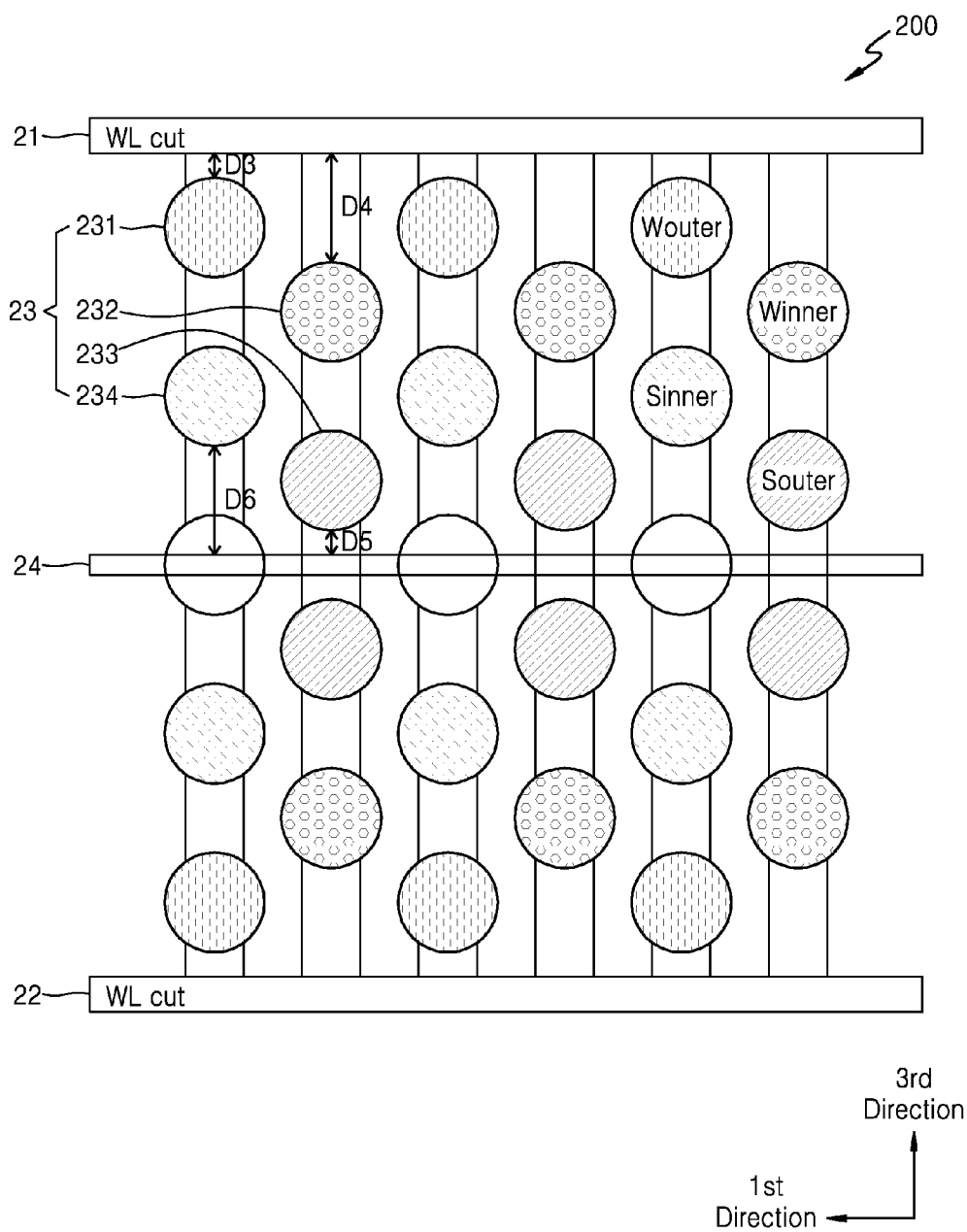
FIG. 7 is a view illustrating another example of a layout of a vertical memory device, according to an embodiment.

FIG. 7 is a view illustrating another example of a layout 200 of a vertical memory device, according to an embodiment.

Referring to FIG. 7, the layout 200 may include first and second word line cut regions 21 and 22, a plurality of channel holes 23, and a string selection line cut region 24. The first and second word line cut regions 21 and 22 may extend to the first direction and may be disposed in parallel with each other. The string selection line cut region 24 may extend in the first direction and may be disposed in parallel with the first and second word line cut regions 21 and 22. The channel holes 23 between the first word line cut region 21 and the string selection cut region 24 may be connected in common to one string selection line, and the channel holes 23 between the second word line cut region 22 and the string selection cut region 24 may be connected in common to another string selection line. The plurality of channel holes 23 may be connected to different bit lines.

In an embodiment, the plurality of channel holes 23 may be classified into four types based on a distance between each channel hole and a word line cut region adjacent thereto and a distance between each channel hole and the string selection line cut region adjacent thereto. Outer channel holes, which are relatively close to the word line cut regions 21 and 22 adjacent thereto, from among the plurality of channel holes 23 may be classified as the first type, Wouter, and inner channel holes, which are relatively distant from the word line cut regions 21 and 22 adjacent thereto, from among the plurality of channel holes 23, may be classified as the second type, Winner. Furthermore, outer channel holes, which are relatively close to the string selection line cut region 24, from among the plurality of channel holes 23, may be classified as the third type, Souter, and inner channel holes, which are relatively distant from the string selection line cut region 24, from among the plurality of channel holes 23, may be classified as the fourth type, Sinner. However, embodiments are not limited thereto. For example, the plurality of channel holes 23 may be classified into four types based on shapes of the plurality of channel holes 23 in the layout or coordinates of the plurality of channel holes 23 in the layout.

In particular, a first channel hole 231 that is spaced apart from the first word line cut region 21 by a third distance D3 may be classified as the first type, and a second channel hole 232 that is spaced apart from the first word line cut region 21 by a fourth distance D4 may be classified as the second type. In this case, the fourth distance D4 may be greater than the third distance D3. Furthermore, a third channel hole 233 that is spaced apart from the string selection line cut region 24 by a fifth distance D5 may be classified as the third type, and a fourth channel hole 234 that is spaced apart from the string selection line cut region 24 by a sixth distance D6 may be classified as the fourth type. In this case, the sixth distance D6 may be greater than the fifth distance D5.

Figure 8:
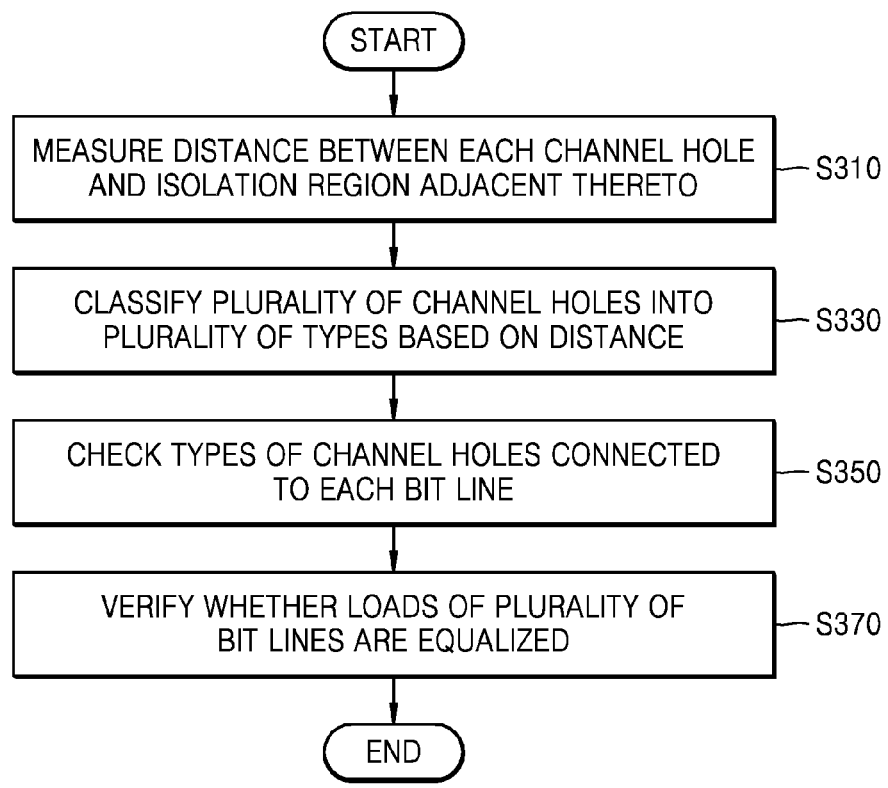
FIG. 8 is a flowchart illustrating a method of verifying a layout of a vertical memory device, according to an embodiment.

FIG. 8 is a flowchart illustrating a method of verifying a layout of a vertical memory device, according to an embodiment.

Referring to FIG. 8, in operation S310, a distance between each channel hole and an isolation region adjacent thereto is measured. In an embodiment, the isolation region may include a word line cut region. In an embodiment, the distance may be measured based on coordinates of a plurality of channel holes in the layout. This will be described below with reference to FIGS. 9 to 12. In an embodiment, the isolation region may include a word line cut region and a string selection line cut region. This will be described below with reference to FIGS. 13 and 14.

In operation S330, the plurality of channel holes is classified into a plurality of types based on distances. In an embodiment, the plurality of channel holes may be classified into at least two types based on a distance between each channel hole and a word line cut region. In an embodiment, the plurality of channel holes may be classified into at least four types based on a distance between each channel hole and a word line cut region adjacent thereto and a distance between each channel hole and a string selection line cut region adjacent thereto. However, embodiments are not limited thereto. For example, the plurality of channel holes may be classified into two types based on a distance between each channel hole and a word line cut region adjacent thereto and a distance between each channel hole and a string selection line cut region adjacent thereto.

In operation S350, types of channel holes connected to each bit line are checked. For example, if the plurality of channel holes is classified into the first type and the second type, a first number of channel holes of the first type, from among the channel holes connected to each bit line, and a second number of channel holes of the second type, from among the channel holes connected to each bit line, may be determined. Below, the first number of channel holes and the second number of channel holes associated with each bit line may be referred to as a "check result" of each bit line.

In operation S370, whether loads of a plurality of bit lines are equalized is verified. In particular, whether the loads of the bit lines are equalized is verified based on check results of the plurality of bit lines. In an embodiment, the first number of channel holes and the second number of channel holes may be compared for each bit line. Bit lines in which the first number of channel holes and the second number of channel holes are the same may be determined as bit lines having equalized loads. In contrast, bit lines in which the first number of channel holes and the second number of channel holes are different from each other may be determined as bit lines having non-equalized loads.

Figure 9:
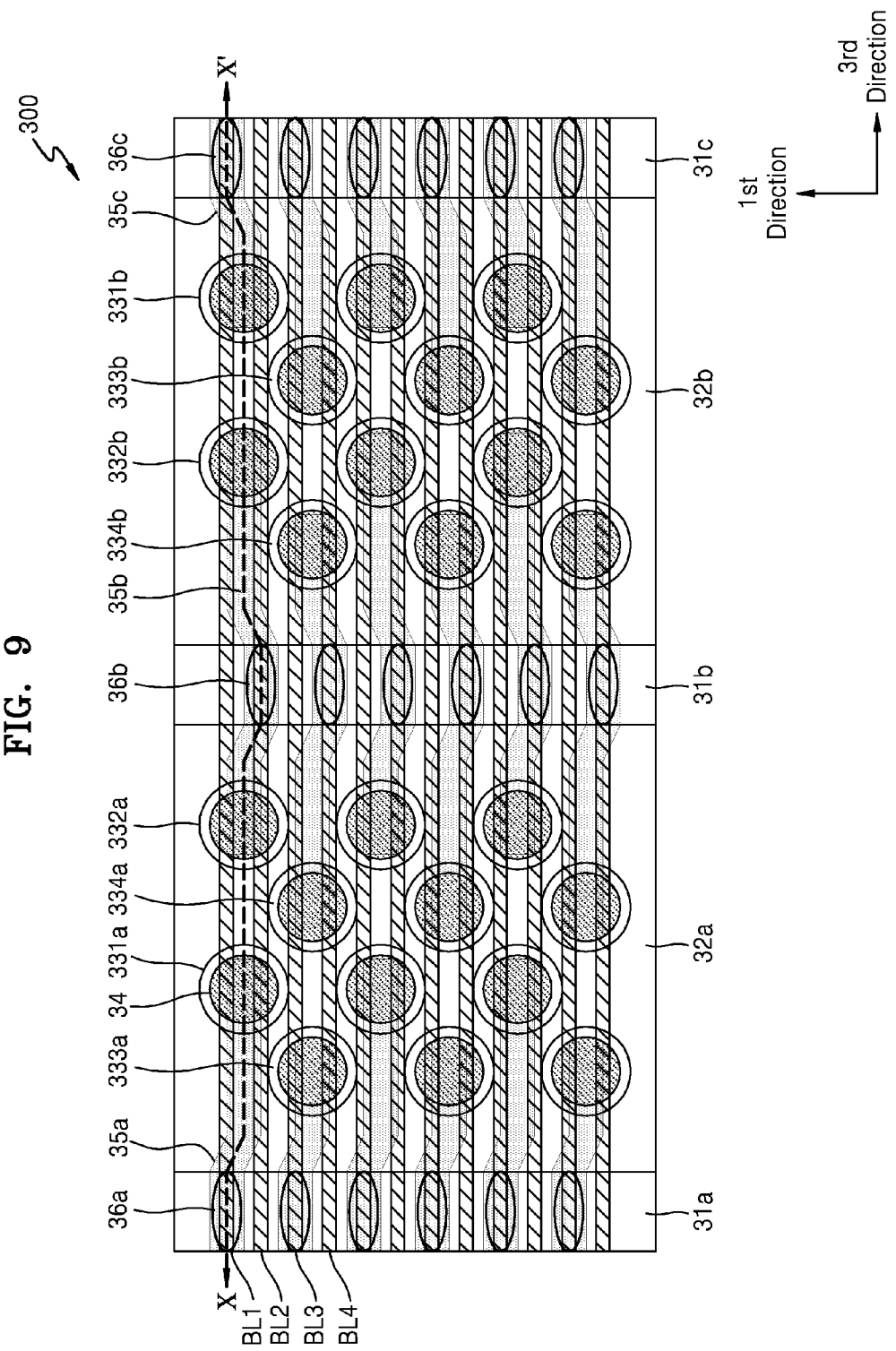
FIG. 9 is a view illustrating an example of a layout of a vertical memory device, according to an embodiment.

FIG. 9 is a view illustrating an example of a layout 300 of a vertical memory device, according to an embodiment.

Referring to FIG. 9, the layout 300 may include first, second, and third word line cut regions 31a, 31b, and 31c, first and second string selection line regions 32a and 32b, a plurality of bit lines BL1 to BL4, and a plurality of channel holes 331a to 334a and 331b to 334b. In an embodiment, the plurality of channel holes 331a to 334a and 331b to 334b may be arranged in the form of zigzag.

The first to third word line cut regions 31a to 31c may extend in the first direction and may be arranged in parallel with each other. The common source line CSL may be disposed in the first to third word line cut regions 31a to 31c. The first string selection line region 32a may be disposed between the first and second word line cut regions 31a and 31b, and the second string selection line region 32b may be disposed between the second and third word line cut regions 31b and 31c. The plurality of bit lines BL1 to BL4 may extend in a third direction and may be arranged in parallel with each other.

Furthermore, the layout 300 may further include drain contacts 34 on the channel holes 331a to 334a and 331b to 334b, conductive lines 35a to 35c for connecting the channel holes 331a to 334a and 331b to 334b with the bit lines BL1 to BL4, and metal contacts 36a to 36c between the conductive lines 35a to 35c and the bit lines BL1 to BL4. Here, the conductive lines 35a to 35c may be referred to as a "routing layer."

In an embodiment, the plurality of channel holes 331a to 334a and 331b to 334b may be classified as a plurality of types based on a distance between each channel hole and an isolation region adjacent thereto. In an embodiment, the isolation region may be each of the word line cut regions 31a to 31c. However, the embodiments are not limited thereto. For example, the plurality of channel holes 331a to 334a and 331b to 334b may be classified as a plurality of types based on shapes of the plurality of channel holes 331a to 334a and 331b to 334b in the layout or coordinates of the plurality of channel holes 331a to 334a and 331b to 334b in the layout.

In particular, in the first string selection line region 32a, the channel hole 331a that is relatively distant from the first word line cut region 31a may be classified as an inner channel hole type, the channel hole 333a that is relatively close to the first word line cut region 31a may be classified as an outer channel hole type, the channel hole 332a that is relatively close to the second word line cut region 31b may be classified as the outer channel hole type, and the channel hole 334a that is relatively distant from the second word line cut region 31b may be classified as the inner channel hole type.

Furthermore, in the second string selection line region 32b, the channel hole 332b that is relatively distant from the second word line cut region 31b may be classified as the inner channel hole type, the channel hole 334b that is relatively close to the second word line cut region 31b may be classified as the outer channel hole type, the channel hole 331b that is relatively close to the third word line cut region 31c may be classified as the outer channel hole type, and the channel hole 333b that is relatively distant from the third word line cut region 31c may be classified as the inner channel hole type.

Firstly, the inner channel hole type will be described. For example, since the channel hole 331a is relatively distant from the first word line cut region 31a, a length of the conductive line 35a connected to the channel hole 331a may be relatively great. Furthermore, as described with reference to FIG. 6B, in the case of the inner channel hole type, since a length of each word line is relatively small and a space between adjacent word lines is relatively great, the interference between word lines may be relatively small. In this case, a load of the first bit line BL1 connected to the channel hole 331a may be great.

Secondly, the outer channel hole type will be described. For example, since the channel hole 332a is relatively close to the second word line cut region 31b, a length of the conductive line 35b connected to the channel hole 332a may be relatively small. Furthermore, as described with reference to FIG. 6B, in the case of the outer channel hole type, since a length of each word line is relatively great and a space between adjacent word lines is relatively small, the interference between word lines may be relatively great. In this case, a load of the second bit line BL2 connected to the channel hole 332a may be small.

As such, a load of each bit line may vary according to whether a channel hole connected to each bit line is the inner channel hole type or the outer channel hole type. In this case, since channel holes connected to each bit line are not concentrated and thus are not of one type only but are regularly distributed and are of the inner channel hole type and the outer channel hole type, loads of the plurality of bit lines may be equalized.

Figure 10:
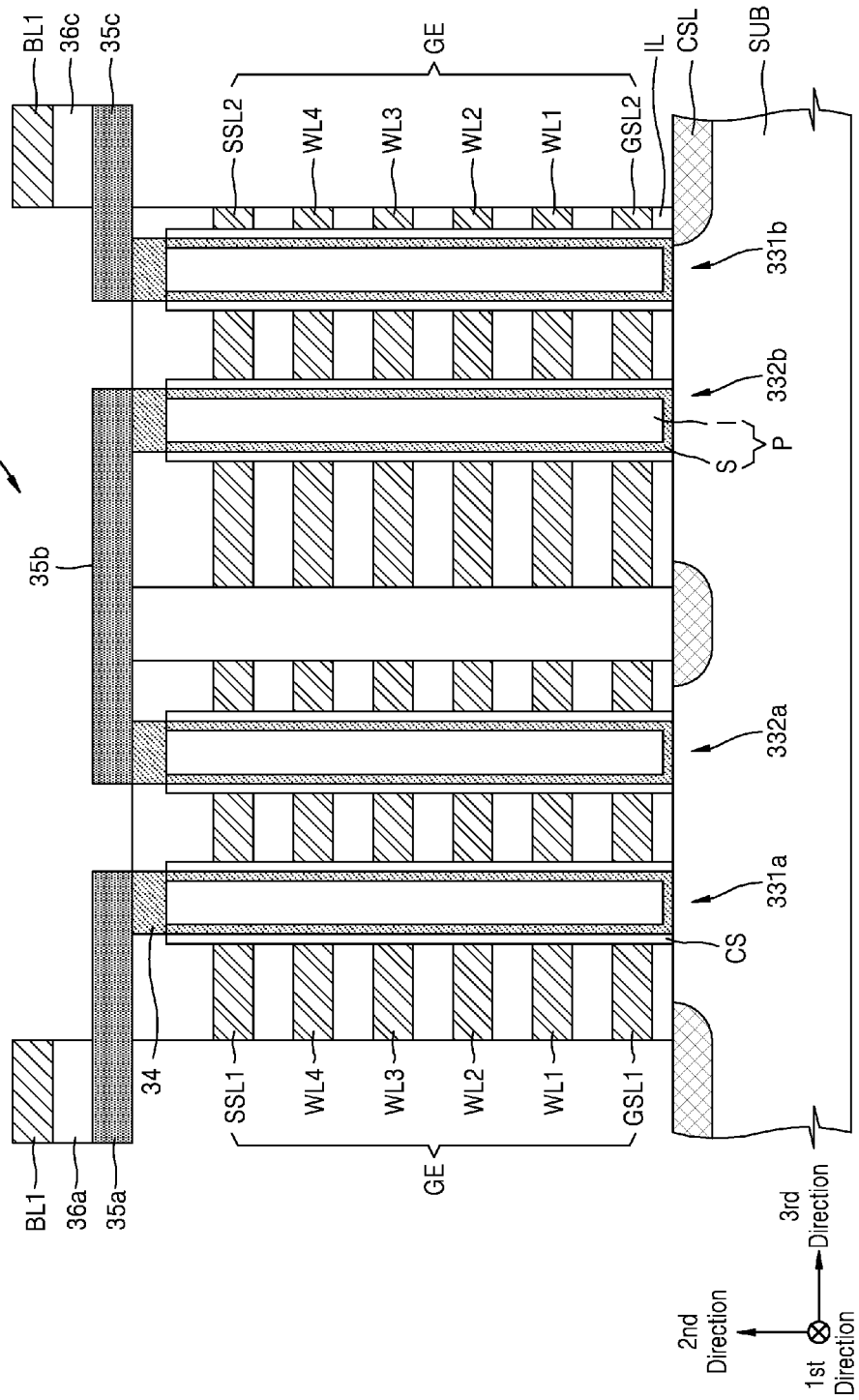
FIG. 10 is a flowchart illustrating a method of manufacturing a vertical memory device, according to an embodiment.

FIG. 10 is a sectional view illustrating an example of a vertical memory device 400 according to an embodiment. FIG. 10 may correspond to a sectional view taken along a line X-X' of FIG. 9.

Referring to FIG. 10, the vertical memory device 400 is formed in a direction perpendicular to a substrate SUB. The substrate SUB is of a first conductivity type (e.g., a p-type), and the common source line CSL that is doped with dopants (or impurities) of a second conductivity type (e.g., an n-type) and extends along the first direction is formed on the substrate SUB. A plurality of insulating layers IL that extend along the first direction are provided sequentially along the second direction on a region of the substrate SUB between two adjacent common source lines CSL. The insulating layers IL are spaced apart from each other by a specific distance along the third direction. For example, each of the plurality of insulating layers IL may include an insulating material such as silicon oxide.

A plurality of pillars "P" that are sequentially disposed along the first direction and penetrate the plurality of insulating layers IL along the second direction are provided on a region of the substrate SUB between two adjacent common source lines CSL. For example, the plurality of pillars "P" may be in contact with the substrate SUB through the plurality of insulating layers IL. In particular, a surface layer "S" of each pillar "P" may include a silicon material of a first type and may function as a channel region. Meanwhile, an inner layer "I" of each pillar "P" may include an insulating material such as silicon oxide or an air gap.

In a region between two adjacent common source lines CSL, a charge storage layer CS may be provided along exposed surfaces of the insulating layers IL, the pillars "P", and the substrate SUB. The charge storage layer CS may include a tunneling insulating layer, a charge trap layer, and a blocking insulating layer. For example, the charge storage layer CS may have an oxide-nitride-oxide (ONO) structure. Furthermore, in the first string selection line region 32a (refer to FIG. 9) between two adjacent common source lines CSL, gate electrodes GE such as selection lines GSL1 and SSL1 and word lines WL1 to WL4 are provided on an exposed surface of the charge storage layer CS. Also, in the second string selection line region 32b (refer to FIG. 9) between two adjacent common source lines CSL, gate electrodes GE such as selection lines GSL2 and SSL2 and word lines WL1 to WL4 are provided on an exposed surface of the charge storage layer CS.

Drains or drain contacts 34 are provided on the plurality of pillars "P", respectively. For example, each of the drains or drain contacts 34 may include a silicon material which is doped with dopants of the second conductivity type. The conductive line 35a is disposed on the drain contact 34 connected to the channel hole 331a, the metal line 36a is disposed on the conductive line 35a, and the first bit line BL1 is disposed on the metal contact 36a. The conductive line 35b may be disposed on the drain contacts 34 connected to the channel holes 332a and 332b, and the conductive line 35b may be connected to the second bit line BL2 of FIG. 9. The conductive line 35c is disposed on the drain contact 34 connected to the channel hole 331b, the metal contact 36c is disposed on the conductive line 35c, and the first bit line BL1 is disposed on the metal contact 36c.

FIG. 11 shows a table, TABLE 1, illustrating a result of classifying channel holes in the layout of FIG. 9.

Referring to FIGS. 9 and 11, according to an embodiment, a plurality of channel holes included in a layout of a vertical memory device may be classified into a plurality of types based on a distance between each channel hole and a word line cut region adjacent thereto, and types of channel holes connected to the plurality of bit lines BL1 to BL4 may be checked for each bit line. According to an embodiment, the table, TABLE 1, indicating types of channel holes in each string selection line region, may be created for each bit line. In an embodiment, an outer channel hole, Outer, may be classified as a first type, and an inner channel hole, Inner, may be classified as a second type.

The channel hole 331a, which is disposed in the first string selection line region 32a, from among the channel holes 331a and 331b connected to the first bit line BL1, is classified as the second type; and the channel hole 331b disposed in the second string selection line region 32b is classified as the first type. Accordingly, in the channel holes 331a and 331b connected to the first bit line BL1, a number of channel holes of the first type may be the same as a number of channel holes of the second type. That is, the number of channel holes of the outer channel hole type may be the same as that of channel holes of the inner channel hole type. In this case, the first bit line BL1 may be determined as being equalized.

The channel hole 332a, which is disposed in the first string selection line region 32a, from among the channel holes 332a and 332b connected to the second bit line BL2 is classified as the first type, and the channel hole 332b disposed in the second string selection line region 32b is classified as the second type. Accordingly, in the channel holes 332a and 332b connected to the second bit line BL2, a number of channel holes of the first type may be the same as a number of channel holes of the second type. That is, the number of channel holes of the outer channel hole type may be the same as that of channel holes of the inner channel hole type. In this case, the second bit line BL2 may be determined as being equalized.

The channel hole 333a, which is disposed in the first string selection line region 32a, from among the channel holes 333a and 333b connected to the third bit line BL3 is classified as the first type, and the channel hole 333b disposed in the second string selection line region 32b is classified as the second type. Accordingly, in the channel holes 333a and 333b connected to the third bit line BL3, a number of channel holes of the first type may be the same as a number of channel holes of the second type. That is, the number of channel holes of the outer channel hole type may be the same as that of the channel holes of the inner channel hole type. In this case, the third bit line BL3 may be determined as being equalized.

The channel hole 334a, which is disposed in the first string selection line region 32a, from among the channel holes 334a and 334b connected to the fourth bit line BL4 is classified as the second type, and the channel hole 334b disposed in the second string selection line region 32b is classified as the first type. Accordingly, in the channel holes 334a and 334b connected to the fourth bit line BL4, a number of channel holes of the first type may be the same as the number of channel holes of the second type. That is, the number of channel holes of the outer channel hole type may be the same as that of the channel holes of inner channel hole type. In this case, the fourth bit line BL4 may be determined as being equalized.

Figure 12:
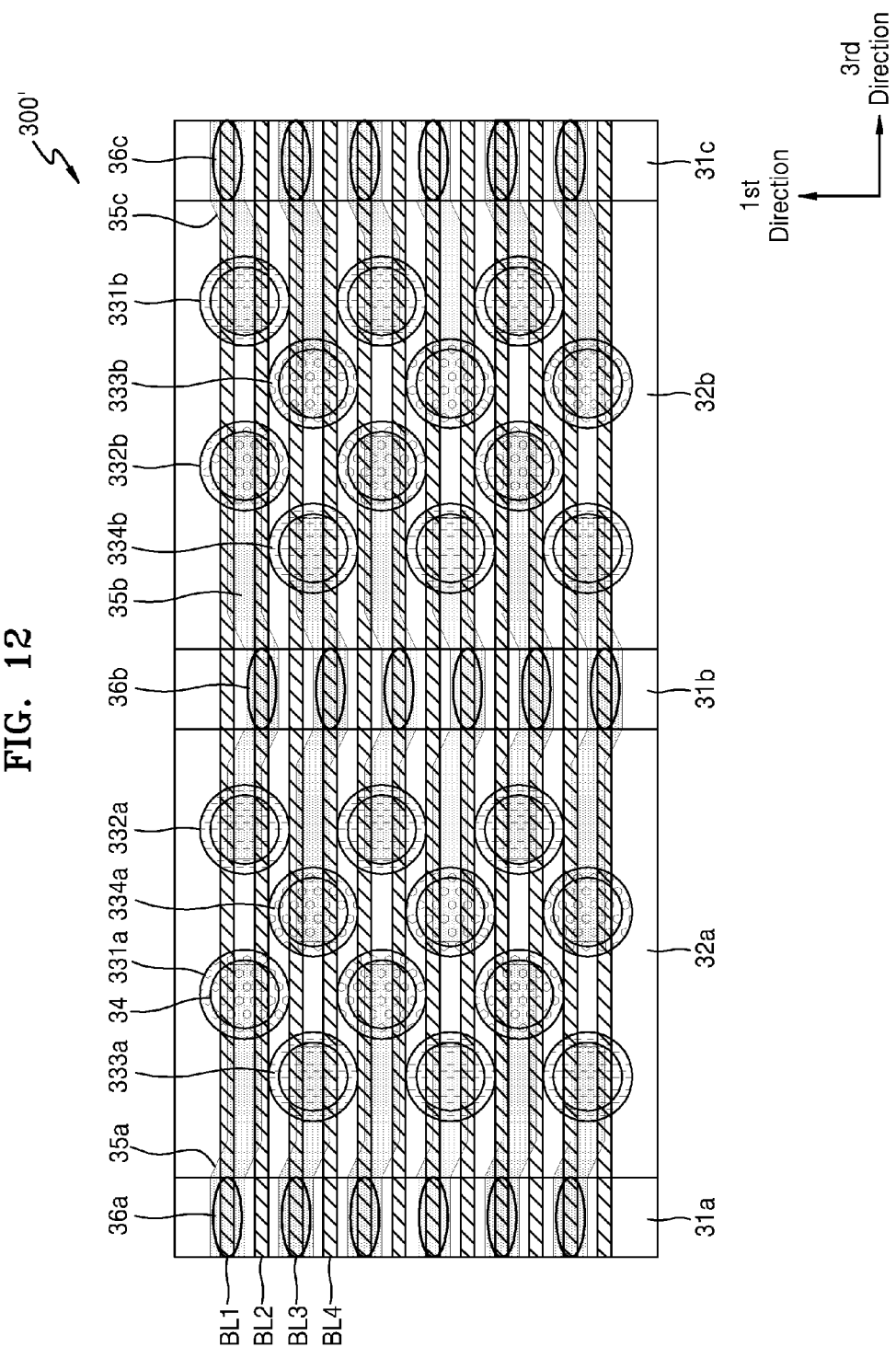
FIG. 12 is a view illustrating a layout according to a result of classifying channel holes in the layout of FIG. 9.

FIG. 12 is a view illustrating a layout 300' according to a result of classifying channel holes included in the layout of FIG. 9.

Referring to FIG. 12, according to an embodiment, a plurality of channel holes in a layout of the vertical memory device may be classified into a plurality of types based on a distance between each channel hole and a word line cut region adjacent thereto, and types of channel holes connected to the plurality of bit lines BL1 to BL4 may be checked for each bit line. According to an embodiment, colors may be allocated according to types of channel holes, and channel holes corresponding to different types may be marked by different colors. In an embodiment, an outer channel hole may be classified as a first type, and an inner channel hole may be classified as a second type.

In some embodiments, an outline type may be determined according to a type of a channel hole. For example, channel holes of the first type may be marked by a solid line, and channel holes of the second type may be marked by a dotted line. In some embodiments, a marking layer may be determined according to a type of a channel hole. For example, a marking layer of a star shape may be applied to channel holes of the first type, and no marking layer may be separately applied to channel holes of the second type.

Figure 13:
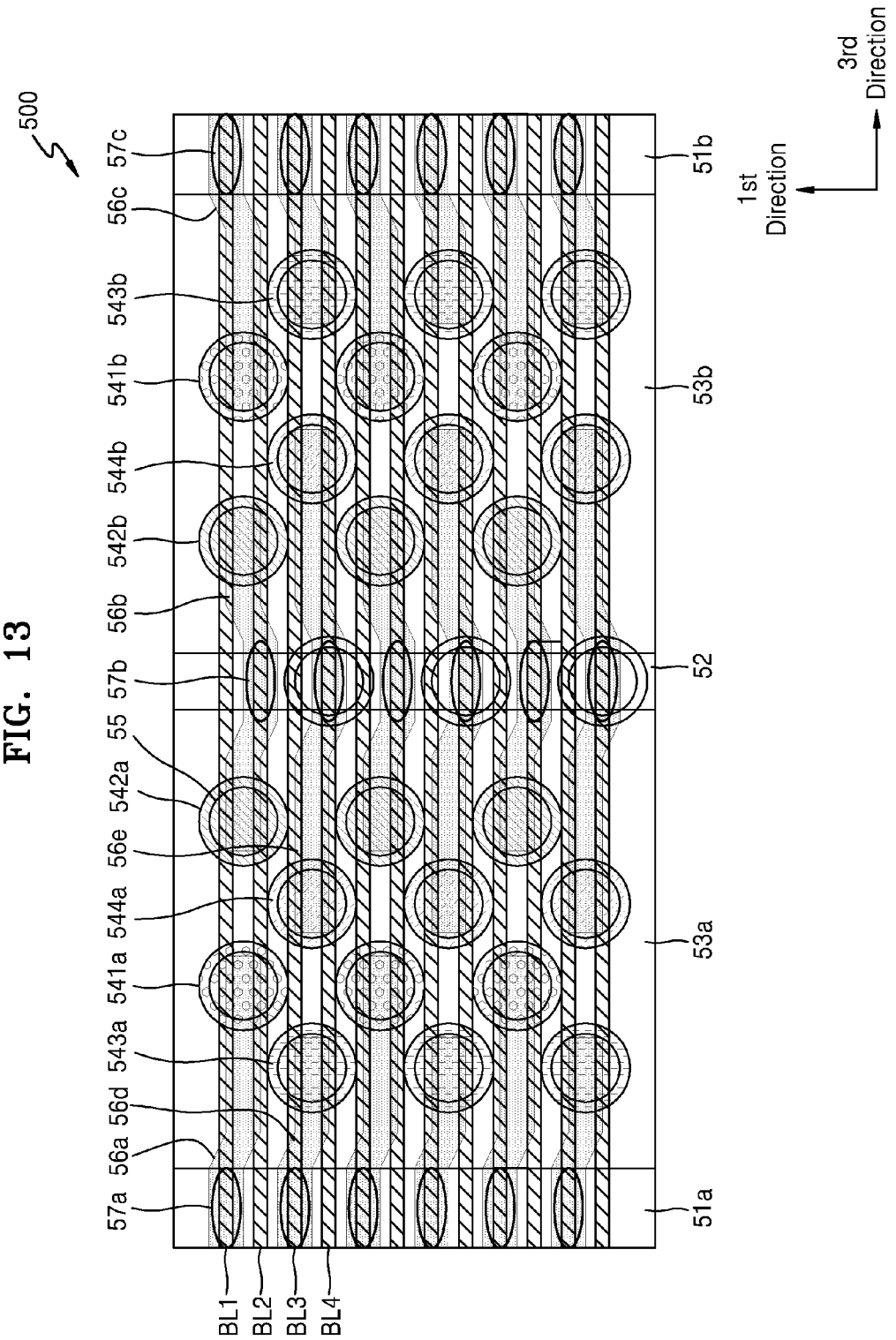
FIG. 13 is a view illustrating another example of a layout of a vertical memory device according to an embodiment.

FIG. 13 is a view illustrating another example of a layout 500 of a vertical memory device, according to an embodiment.

Referring to FIG. 13, the layout 500 may include first and second word line cut regions 51a and 51b, a string selection line cut 52, first and second string selection line regions 53a and 53b, a plurality of bit lines BL1 to BL4, and a plurality of channel holes 541a to 544a and 541b to 544b. In an embodiment, the plurality of channel holes 541a to 544a and 541b to 544b may be arranged in a zigzag pattern.

The first and second word line cut regions 51a and 51b may extend in the first direction and may be arranged in parallel with each other. The common source line CSL may be disposed in the first and second word line cut regions 51a and 51b. The first string selection line region 53a may be disposed between the first word line cut region 51a and the string selection line cut region 52, and the second string selection line region 53b may be disposed between the string selection line cut region 52 and the second word line cut region 51b. The plurality of bit lines BL1 to BL4 may extend in the third direction and may be arranged in parallel with each other.

Furthermore, the layout 500 may further include drain contacts 55 on the channel holes 541a to 544a and 541b to 544b, conductive lines 56a to 56e for connecting the channel holes 541a to 544a and 541b to 544b with the bit lines BL1 to BL4, and metal contacts 57a to 57c between the conductive lines 56a to 56e and the bit lines BL1 to BL4. Here, the conductive lines 56a to 56e may be referred to as a "routing layer."

In an embodiment, the plurality of channel holes 541a to 544a and 541b to 544b may be classified into a plurality of types based on a distance between each channel hole and an isolation region adjacent thereto. In an embodiment, the isolation region may include the word line cut regions 51a, 51b and the string selection line cut region 52. However, the embodiments are not limited thereto. For example, the plurality of channel holes 541a to 544a and 541b to 544b may be classified into a plurality of types based on shapes of the plurality of channel holes 541a to 544a and 541b to 544b in the layout or coordinates of the plurality of channel holes 541a to 544a and 541b to 544b in the layout.

In particular, in the first string selection line region 53a, the channel hole 543a that is relatively close to the first word line cut region 51a may be classified as a word line outer channel hole type (hereinafter referred to as a "first type"), the channel hole 541a that is relatively distant from the first word line cut region 51a may be classified as a word line inner channel hole type (hereinafter referred to as a "second type"), the channel hole 542a that is relatively close to the string selection line cut region 52 may be classified as a string selection line outer channel hole type (hereinafter referred to as a "third type"), and the channel hole 544a that is relatively distant from the string selection line cut region 52 may be classified as a string selection line inner channel hole type (hereinafter referred to as a "fourth type").

Furthermore, in the second string selection line region 53b, the channel hole 542b that is relatively close to the string selection line cut region 52 may be classified as the third type, the channel hole 544b that is relatively distant from the string selection line cut region 52 may be classified as the fourth type, the channel hole 543b that is relatively close to the second word line cut region 51b may be classified as the first type, and the channel hole 541b that is relatively distant from the second word line cut region 51b may be classified as the second type.

Firstly, the first type will be described. For example, since the channel hole 543a is relatively close to the first word line cut region 51a, a length of the conductive line 55d connected to the channel hole 543a may be relatively small. In this case, a load of the third bit line BL3 connected to the channel hole 543a may be great. Secondly, the second type will be described. For example, since the channel hole 541a is relatively distant from the first word line cut region 51a, a length of the conductive line 55a connected to the channel hole 541a may be relatively great. In this case, a load of the first bit line BL1 connected to the channel hole 541a may be small.

Thirdly, the third type will be described. For example, since the channel hole 542a is relatively close to the string selection line cut region 52, a length of the conductive line 55b connected to the channel hole 542a may be relatively small. In this case, a load of the second bit line BL2 connected to the channel hole 542a may be small. Fourthly, the fourth type will be described. For example, since the channel hole 544a is relatively distant from the string selection line cut region 52, a length of the conductive line 55e connected to the channel hole 544a may be relatively great. In this case, a load of the fourth bit line BL4 connected to the channel hole 544a may be great.

As such, a load of each bit line may vary according to whether a channel hole connected to each bit line is of a word line inner channel hole type or a word line outer channel hole type and whether the channel hole connected to each bit line is of a string selection line inner channel hole type or a string selection line outer channel hole type. In this case, since channel holes connected to each bit line are not concentrated on one type but are uniformly distributed to the word line inner channel hole type, the word line outer channel hole type, the string selection line inner channel hole type, and the string selection line outer channel hole type, loads of the plurality of bit lines may be equalized.

FIG. 14 is a table, TABLE 2, illustrating a result of classifying channel holes included in the layout of FIG. 13.

Referring to FIGS. 13 and 14, according to an embodiment, a plurality of channel holes included in a layout of a vertical memory device may be classified into a plurality of types based on a distance between each channel hole and a word line cut region or string selection line cut region adjacent thereto, and types of channel holes connected to the plurality of bit lines BL1 to BL4 may be checked for each bit line. According to an embodiment, the table, TABLE 2, indicating types of channel holes included in each string selection line region may be created for each bit line. In an embodiment, a word line outer channel hole Wouter may be classified as the first type, a word line inner channel hole Winner may be classified as the second type, a string selection line outer channel hole Souter may be classified as the third type, a string selection line inner channel hole Sinner may be classified as the fourth type.

In the channel holes 541a and 541b connected to the first bit line BL1, the channel hole 541a disposed in the first string selection line region 53a and the channel hole 541b disposed in the second string selection line region 53b all have the second type. Accordingly, in the channel holes 541a and 541b connected to the first bit line BL1, the number of channel holes having the first type may be different from the number of channel holes having the second type. In this case, the first bit line BL1 may be determined as being not equalized.

In the channel holes 542a and 542b connected to the second bit line BL2, the channel hole 542a disposed in the first string selection line region 53a and the channel hole 542b disposed in the second string selection line region 53b all have the third type. Accordingly, in the channel holes 542a and 542b connected to the second bit line BL2, the number of channel holes having the third type may be different from the number of channel holes having the fourth type. In this case, the second bit line BL2 may be determined as being not equalized.

In the channel holes 543a and 543b connected to the third bit line BL3, the channel hole 543a disposed in the first string selection line region 53a and the channel hole 543b disposed in the second string selection line region 53b all have the first type. Accordingly, in the channel holes 543a and 543b connected to the third bit line BL3, the number of channel holes having the first type may be different from the number of channel holes having the second type. In this case, the third bit line BL3 may be determined as being not equalized.

In the channel holes 544a and 544b connected to the fourth bit line BL4, the channel hole 544a disposed in the first string selection line region 53a and the channel hole 544b disposed in the second string selection line region 53b all have the fourth type. Accordingly, in the channel holes 544a and 544b connected to the fourth bit line BL4, the number of channel holes having the third type may be different from the number of channel holes having the fourth type. In this case, the fourth bit line BL4 may be determined as being not equalized.

Figure 15:
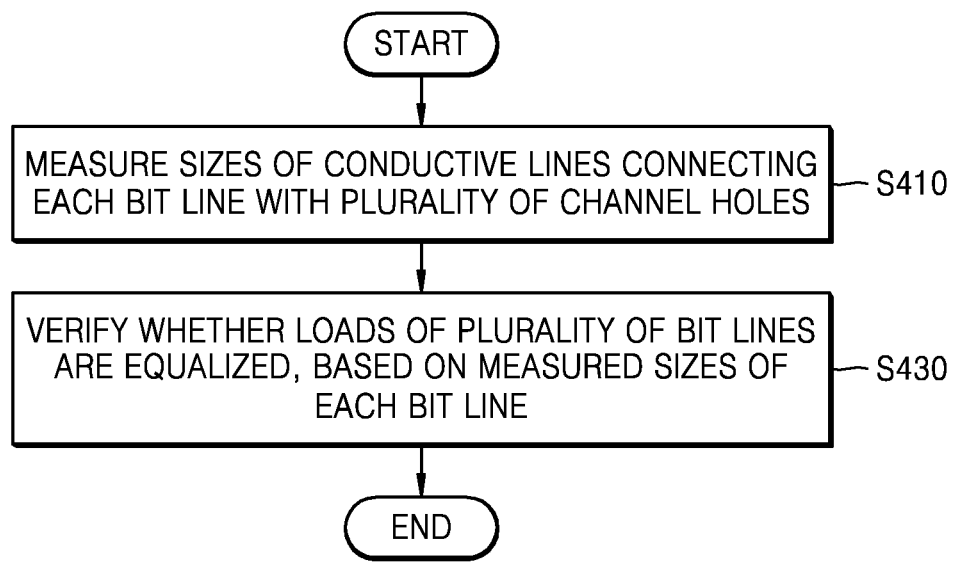
FIG. 15 is a flowchart illustrating a method of verifying a layout of a vertical memory device, according to an embodiment.

FIG. 15 is a flowchart illustrating a method of verifying a layout of a vertical memory device, according to an embodiment.

Referring to FIG. 15, in operation S410, sizes of conductive lines connecting a plurality of channel holes with each of a plurality of bit lines included in the layout of the vertical memory device are measured. Here, the size of the conductive line may include a length, width, or shape of the conductive line or a space between adjacent conductive lines. Here, the conductive line may correspond to a routing layer between each bit line and a plurality of channel holes.

In operation S430, whether loads of the plurality of bit lines are equalized is verified based on the sizes measured for respective bit lines. In an embodiment, sums of sizes of conductive lines that correspond to the plurality of bit lines are compared with each other. In particular, in each bit line, a sum of lengths of conductive lines each of which is used to connect a channel hole to a bit line may be calculated. Whether the sums that respectively correspond to the bit lines are the same may be determined. In this case, bit lines in which sums of lengths of conductive lines are the same may be determined as loads of the bit lines are successfully equalized; bit lines in which sums of lengths of conductive lines are different from each other may be determined as loads thereof are not equalized.

In an embodiment, whether shapes of conductive lines that correspond to each of the plurality of bit lines are the same may be determined. In this case, bit lines in which shapes of conductive lines are the same may be determined as loads thereof are successfully equalized. Bit lines in which shapes of conductive lines are different from each other may be determined as loads thereof are not equalized. In an embodiment, whether widths or areas of conductive lines that correspond to each of the plurality of bit lines are the same may be determined. In this case, bit lines in which widths or areas of conductive lines are the same may be determined as loads thereof are successfully equalized. Bit lines in which widths or areas of conductive lines are different from each other may be determined as loads thereof are not equalized. In an embodiment, whether conductive lines that correspond to each of the plurality of bit lines are disposed at regular intervals may be determined. In this case, bit lines in which conductive lines are disposed at regular intervals may be determined as loads thereof are successfully equalized. Bit lines in which conductive lines are disposed at irregular intervals may be determined as loads thereof are not equalized.

Figure 16:
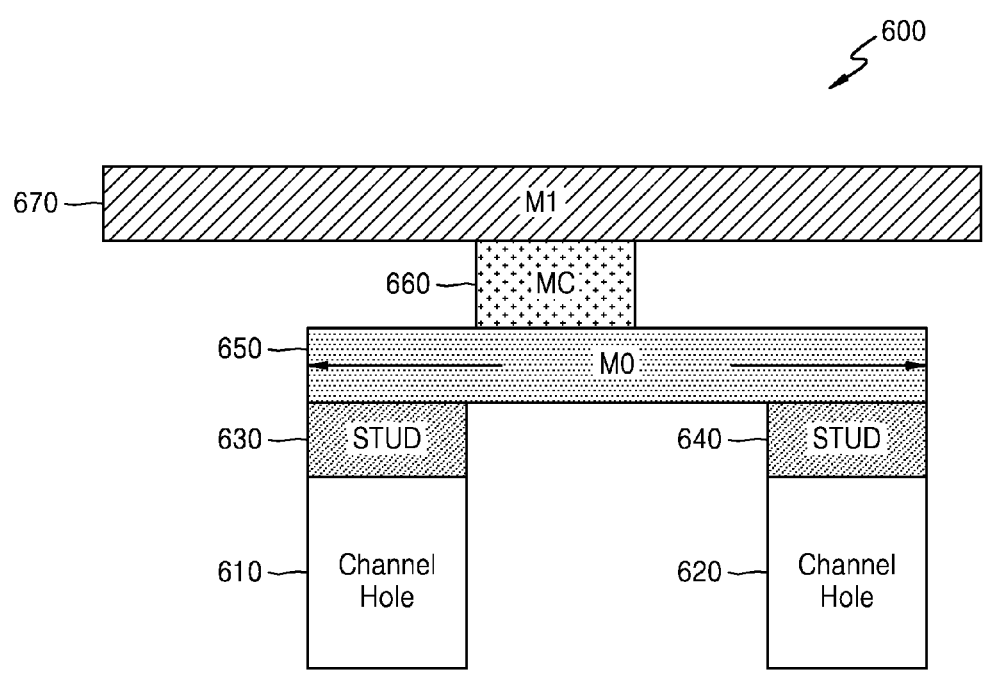
FIG. 16 is a sectional view schematically illustrating a vertical memory device according to an embodiment.

FIG. 16 is a sectional view schematically illustrating a vertical memory device 600 according to an embodiment.

Referring to FIG. 16, the vertical memory device 600 may include first and second channel holes 610 and 620, first and second studs 630 and 640, a conductive line (M0) 650, a metal contact (MC) 660, and a bit line (M1) 670. All of the first and second channel holes 610 and 620 may be connected to the same bit line 670. The first and second studs 630 and 640 may be disposed on the first and second channel holes 610 and 620, respectively. Each of the first and second studs 630 and 640 may be a drain contact.

In an embodiment, the first and second channel holes 610 and 620 may correspond to the channel holes 332a and 332b of FIG. 9, respectively. The conductive line 650 may correspond to the conductive line 35b of FIG. 9. Furthermore, the metal contact 660 may correspond to the metal contact 36b of FIG. 9, and the bit line 670 may correspond to the second bit line BL2 of FIG. 9. In an embodiment, the first and second channel holes 610 and 620 may correspond to the channel holes 542a and 542b of FIG. 13, respectively. The conductive line 650 may correspond to the conductive line 56b of FIG. 13. Furthermore, the metal contact 660 may correspond to the metal contact 57b of FIG. 13, and the bit line 670 may correspond to the second bit line BL2 of FIG. 13.

Figure 17:
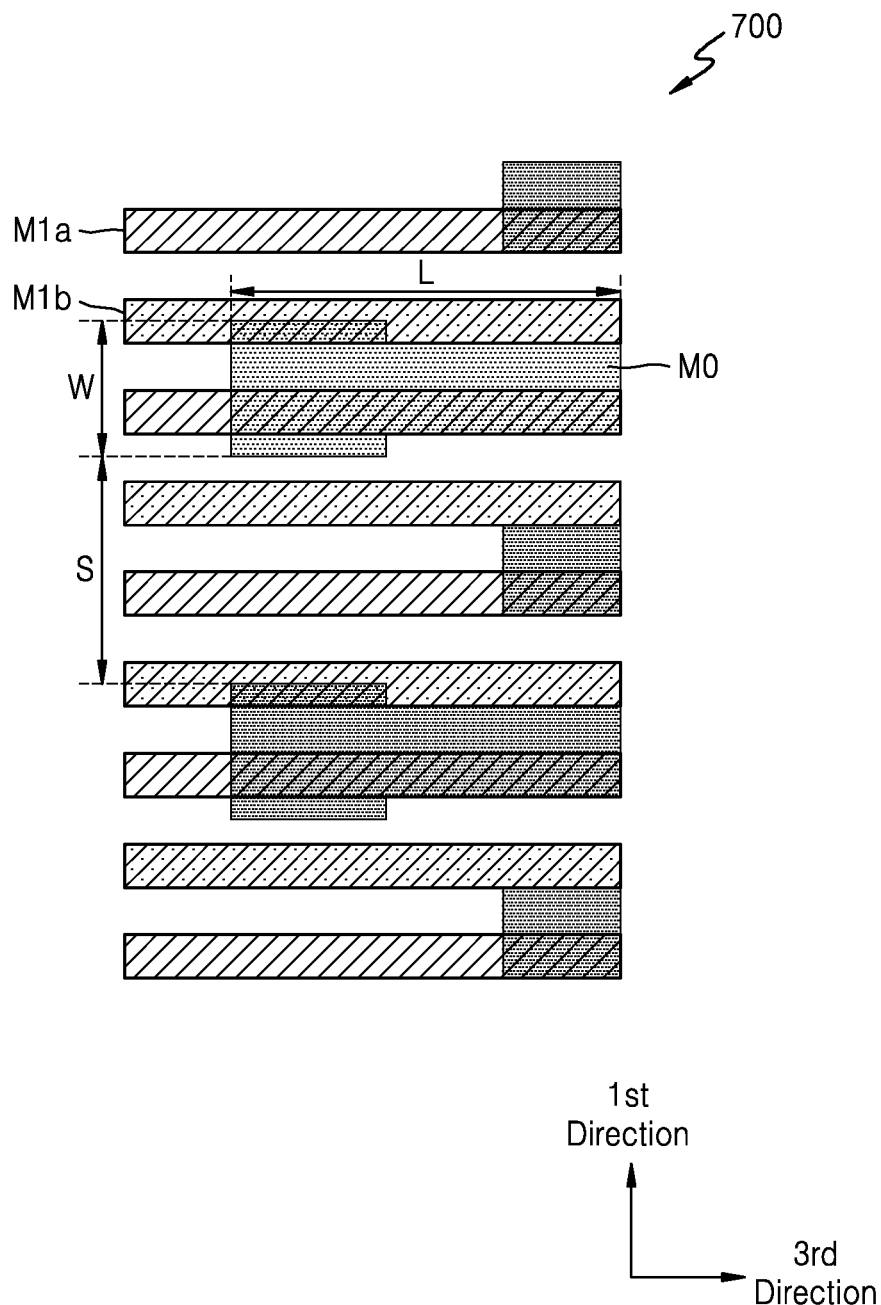
FIG. 17 is a view illustrating a result of measuring sizes of conductive lines in a layout of a vertical memory device according to an embodiment.

FIG. 17 is a view illustrating a result of measuring sizes of conductive lines in a layout 700 of a vertical memory device according to an embodiment.

Referring to FIG. 17, the layout 700 may include conductive lines M0 and bit lines M1a and M1b. According to an embodiment, in the layout 700, a width W, a length L, or a shape of each conductive line M0 or a space "S" between adjacent conductive lines may be measured.

In an embodiment, a sum of a first length of a conductive line used to connect a first channel hole to the bit line M1a and a second length of a conductive line used to connect a second channel hole to the bit line M1a may be calculated. In an embodiment, a sum of a third length of a conductive line used to connect a third channel hole to the bit line M1b and a fourth length of a conductive line used to connect a fourth channel hole to the bit line M1b may be calculated. When the sum of the first and second lengths is the same as the sum of the third and fourth lengths, the bit lines M1a and M1b may be determined as having equalized loads. In contrast, when the sum of the first and second lengths is different from the sum of the third and fourth lengths, the bit lines M1a and M1b may be determined as having non-equalized loads.

Figure 18:
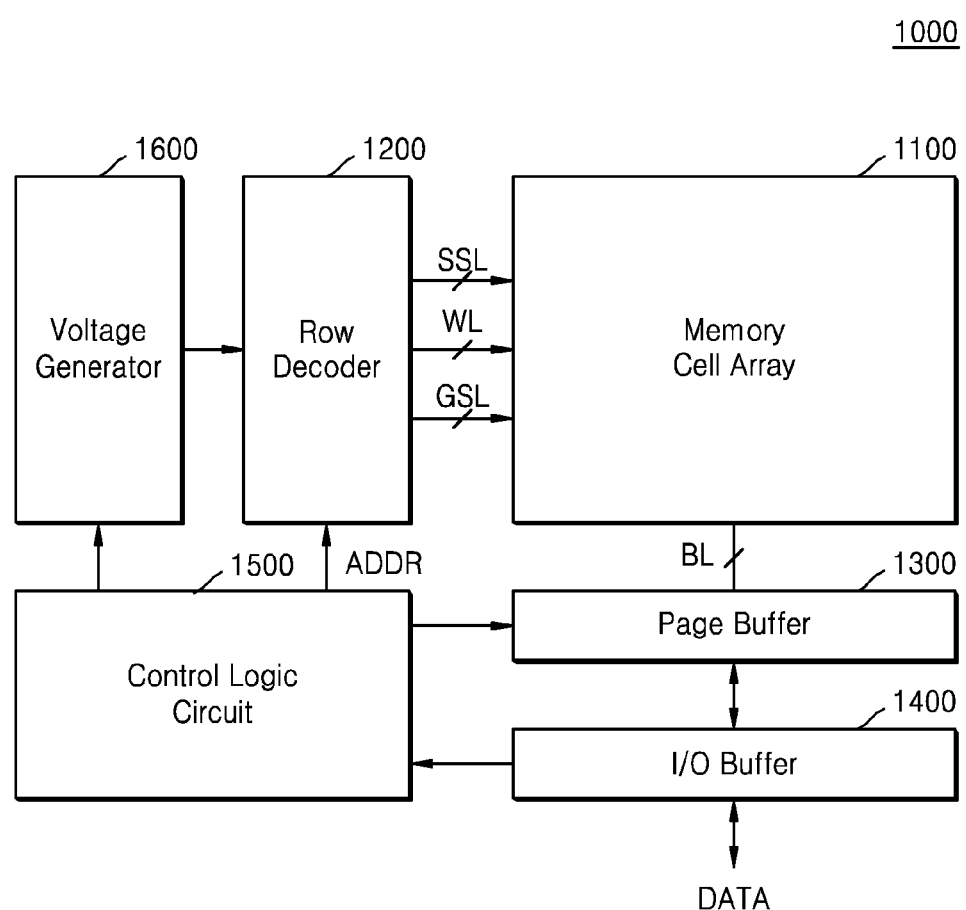
FIG. 18 is a block diagram illustrating a vertical memory device according to some embodiments.

FIG. 18 is a block diagram illustrating a vertical memory device 1000 according to some embodiments.

Referring to FIG. 18, the vertical memory device 1000 may include a memory cell array 1100, a row decoder 1200, a page buffer 1300, an input/output circuit 1400, a control logic circuit 1500, and a voltage generator 1600. The memory cell array 1100 may include a plurality of memory cells connected to a plurality of word lines vertically stacked on a substrate. The memory cell array 1100 may be connected to the row decoder 1200 through word lines WL and selection lines SSL and GSL. The memory cell array 1100 may be connected to the page buffer 1300 through bit lines BL.

According to an embodiment, the vertical memory device 1000 may be manufactured by performing the layout verifying method illustrated in FIG. 9. In this case, loads of a plurality of bit lines included in the memory cell array 1100 may be equalized, thereby improving an operating speed of the vertical memory device 1000 including the memory cell array 1100.

The row decoder 1200 may select one of memory blocks of the memory cell array 1100 in response to an address ADDR. Furthermore, the row decoder 1200 may select one of the word lines in the selected memory block. The row decoder 1200 may supply a word line voltage to the selected word line in the selected memory block. During a program operation, the row decoder 1200 may supply a program voltage to the selected word line and a pass voltage to each of unselected word lines, respectively. During a read operation, the row decoder 1200 may supply a selection read voltage to the selected word line and a non-selection read voltage to each of unselected word lines, respectively. In this case, the non-selection read voltage may be supplied to the selection lines GSL and SSL.

The page buffer 1300 may operate as a write driver or a sense amplifier based on a mode of operation. During the program operation, the page buffer 1300 may supply a bit line voltage corresponding to data to be programmed to a bit line of the memory cell array 1100. During the read operation, the page buffer 1300 may sense data stored in a selected memory cell through a bit line. The page buffer 1300 may latch the sensed data and may output the latched data to the outside (or an external device). During an erase operation, the page buffer 1300 may float the bit lines.

The input/output 1400 may provide write data, DATA, which is received from the outside, to the page buffer 1300 during the program operation. The input/output buffer 1400 may output data, DATA, which is provided from the page buffer 1300, to the outside during the read operation. The input/output buffer 1400 may provide a received address or command to the row decoder 1200 or the control logic circuit 1500. The control logic circuit 1500 may control the row decoder 1200, the page buffer 1300, the voltage generator 1600, etc. in response to a command received from the outside for an access to selected memory cells.

The voltage generator 1600 may generate various word line voltages to be supplied to the word lines and a voltage to be supplied to a bulk (e.g., a well region) where memory cells are formed, under control of the control logic circuit 1500. Word line voltages to be supplied to word lines may include a program voltage, a pass voltage, a selection read voltage, and a non-selection read voltage. The voltage generator 1600 may generate voltages for selecting memory cells during the read operation or program operation (or referred to as a "write operation"). For example, the voltage generator 1600 generates voltages to be supplied to the word lines WL and the selection lines SSL and GSL. The voltages generated by the voltage generator 1600 may be supplied to the memory cell array 1100 through the row decoder 1200.

Figure 19:
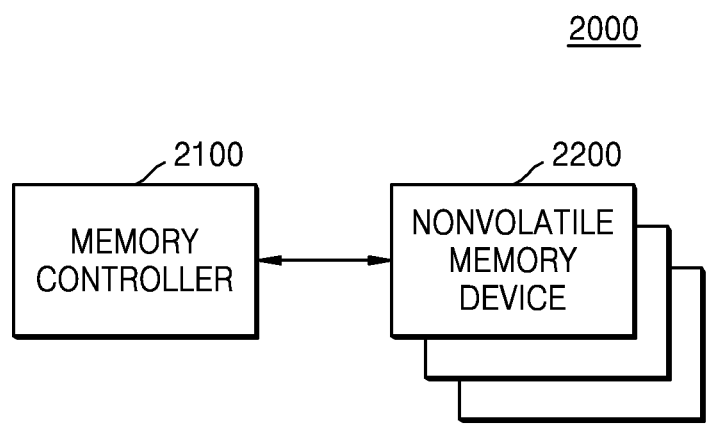
FIG. 19 is a block diagram illustrating a memory system including a vertical memory device according to some embodiments.

FIG. 19 is a block diagram illustrating a memory system 2000 including a vertical memory device according to some embodiments.

Referring to FIG. 19, the memory system 2000 includes a memory controller 2100 and a plurality of nonvolatile memory devices 2200. The memory controller 2100 may receive data from a host and may store the received data in the plurality of nonvolatile memory devices 2200. The plurality of nonvolatile memory devices 2200 may be manufactured according to the methods described with reference to FIGS. 1 to 17.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to the embodiments thereof, it will be understood that various changes in form and details may be made therein without departing from the spirit and scope of the following claims.

What is claimed is:

1. A method of manufacturing a vertical memory device, the method comprising:
classifying a plurality of channel holes in a layout of the vertical memory device into a plurality of types based on at least one of a distance between each channel hole and an isolation region adjacent thereto, shapes of the plurality of channel holes in the layout, and coordinates of the plurality of channel holes in the layout;
identifying the types of channel holes connected to each of a plurality of bit lines in the layout;
verifying whether loads of the plurality of bit lines are equalized, based on the identified types of channel holes for each bit line;
manufacturing, upon verifying that the loads of the bit lines are equalized, an etching mask for the vertical memory device based upon the layout; and
manufacturing the vertical memory device by etching a multi-layered device to which the etching mask has been applied, wherein
the loads of the bit lines within the manufactured vertical memory device are equalized.

2. The method of claim 1, further comprising, before the classifying, measuring the distance between each channel hole and the adjacent isolation region.

3. The method of claim 2, wherein the measuring comprises measuring the distance based on the coordinates of the plurality of channel holes in the layout.

4. The method of claim 1, wherein the isolation region comprises a word line cut region.

5. The method of claim 4, wherein the classifying comprises classifying the plurality of channel holes into a first type of channel holes relatively close to the word line cut region and a second type of channel holes relatively distant from the word line cut region.

6. The method of claim 5, wherein the identifying comprises identifying the number of first-type channel holes, from among channel holes connected to each bit line, and the number of second-type channel holes, from among the channel holes connected to each bit line.

7. The method of claim 6, wherein the verifying comprises:
comparing the number of first-type channel holes with the number of second-type channel holes for each bit line;
determining bit lines having equalized loads, among the plurality of bit lines, as those having the number of first-type channel holes equal to the number of second-type channel holes; and
determining bit lines having non-equalized loads, among the plurality of bit lines, as those having the number of first-type channel holes that is different from the number of second-type channel holes.

8. The method of claim 1, wherein the isolation region comprises a word line cut region and a string selection line cut region.

9. The method of claim 8, wherein the classifying comprises classifying the plurality of channel holes into first-type channel holes being closest to the word line cut region, second-type channel holes being second closest to the word line cut region, third-type channel holes being closest to the string selection line cut region, and fourth-type channel holes being second closest to the string selection line cut region.

10. The method of claim 9, wherein the identifying comprises identifying the number of first-type channel holes, from among channel holes connected to each bit line, the number of second-type channel holes, from among the channel holes connected to each bit line, the number of third-type channel holes, from among the channel holes connected to each bit line, and the number of fourth-type channel holes, from among the channel holes connected to each bit line.

11. The method of claim 10, wherein the verifying comprises:
comparing the numbers of first- to fourth-type channel holes for each bit line;
determining bit lines having equalized loads, among the plurality of bit lines, as those having the number of first-type channel holes that is equal to the number of second-type channel holes or the number of third-type channel holes that is equal to the number of fourth-type channel holes; and
determining bit lines having non-equalized loads, among the plurality of bit lines, as those having the number of first-type channel holes that is different from the number of second-type channel holes or the number of third-type channel holes that is different from the number of fourth-type channel holes.

12. A method of manufacturing a vertical memory device, the method comprising:
  measuring sizes of conductive lines connecting a plurality of channel holes to each of a plurality of bit lines in a layout of the vertical memory device;
  verifying whether loads of the plurality of bit lines are equalized, based on the measured sizes of the conductive lines for each of the bit lines;
  manufacturing, upon verifying that the loads of the bit lines are equalized, an etching mask for the vertical memory device based upon the layout; and
  manufacturing the vertical memory device by etching a multi-layered device to which the etching mask has been applied, wherein
  the loads of the bit lines within the manufactured vertical memory device are equalized.

13. The method of claim 12, wherein the measuring comprises measuring a length, a width, or a shape of each conductive line or a distance between adjacent conductive lines.

14. The method of claim 12, wherein each of the conductive lines corresponds to a routing layer between a corresponding bit line and corresponding channel holes.

15. The method of claim 12, wherein the verifying comprises:
  comparing sizes of conductive lines corresponding to each of the plurality of bit lines;
  determining bit lines having equalized loads, among the plurality of bit lines, as those to which conductive lines of the same size are connected; and
  determining bit lines having non-equalized loads, among the plurality of bit lines, as those to which conductive lines of different sizes are connected.

16. A method of manufacturing a vertical memory device, the method comprising:
  determining, for each of a plurality of bit lines, a load presented by channel holes and conductive traces connecting the channel holes to the bit line, based upon a layout of the vertical memory device;
  determining whether the load presented to each of the bit lines is equalized with the load presented to every other of the bit lines;
  manufacturing, upon determining that the loads of the bit lines are equalized, an etching mask for the vertical memory device based upon the layout; and
  manufacturing the vertical memory device by etching a multi-layered device to which the etching mask has been applied, wherein
  the load presented to each of the bit lines, within the manufactured vertical memory device, is equalized with the load presented to every other of the bit lines, within the manufactured vertical memory device.

17. The method of claim 16, wherein, for each bit line, the load is determined from the distance between each of the channel holes, connected to the bit line, and an isolation region adjacent to the channel hole.

18. The method of claim 16, wherein, for each bit line, the load is determined from the shapes of the channel holes, connected to the bit line, in the layout.

19. The method of claim 16, wherein, for each bit line, the load is determined from the coordinates of the channel holes, connected to the bit line, in the layout.

20. The method of claim 17, wherein the isolation region is a word-line cut region or a string-selection line cut region.

* * * * *